United States Patent
Bonnin et al.

(10) Patent No.: US 11,064,635 B2
(45) Date of Patent: Jul. 13, 2021

(54) PROTOCOL FOR COMMUNICATION BETWEEN A PLURALITY OF LIQUID COOLING MODULES FOR COMPUTER SERVERS

(71) Applicant: BULL SAS, Les Clayes Sous Bois (FR)

(72) Inventors: Jean-Christophe Bonnin, Rambouillet (FR); Elyès Zekri, Le Coudray (FR)

(73) Assignee: BULL SAS, Les Clayes Sous Bois (FR)

( * ) Notice: Subject to any disclaimer, the term of this patent is extended or adjusted under 35 U.S.C. 154(b) by 68 days.

(21) Appl. No.: 16/340,873

(22) PCT Filed: Oct. 10, 2017

(86) PCT No.: PCT/FR2017/052781
§ 371 (c)(1),
(2) Date: Apr. 10, 2019

(87) PCT Pub. No.: WO2018/069634
PCT Pub. Date: Apr. 19, 2018

(65) Prior Publication Data
US 2019/0246526 A1    Aug. 8, 2019

(30) Foreign Application Priority Data
Oct. 10, 2016  (FR) ...................................... 16 59754

(51) Int. Cl.
*H05K 7/20*  (2006.01)
*G05B 19/4155*  (2006.01)
(Continued)

(52) U.S. Cl.
CPC ..... *H05K 7/20836* (2013.01); *G05B 19/4155* (2013.01); *G06F 13/42* (2013.01);
(Continued)

(58) Field of Classification Search
CPC ............ H05K 7/20836; H05K 7/1498; H05K 7/20272; H05K 7/20281; H05K 7/20781;
(Continued)

(56) References Cited

U.S. PATENT DOCUMENTS

| | | | | |
|---|---|---|---|---|
| 5,058,389 A | * | 10/1991 | Yasuda | .............. G05D 23/1919 361/679.46 |
| 8,538,843 B2 | * | 9/2013 | Smith | ...................... H04L 47/70 705/35 |

(Continued)

FOREIGN PATENT DOCUMENTS

| | | |
|---|---|---|
| FR | 2 924 554 | 6/2009 |
| WO | WO 2016/019386 | 2/2016 |
| WO | WO 2016/069417 | 5/2016 |

OTHER PUBLICATIONS

International Search Report, PCT/FR2017/052781, dated Jan. 17, 2018.

*Primary Examiner* — Robert A Cassity
(74) *Attorney, Agent, or Firm* — Meagher Emanuel Laks Goldberg & Liao, LLP.

(57) ABSTRACT

Disclosed is a method of communication between a plurality of liquid cooling modules of a cooling system for one or more one computer servers, in which: the cooling modules communicate with each other in a manner that operates in N+1 redundancy where N is greater than or equal to 2, so as to enable a standard replacement of any one of these cooling modules without stopping the cooling and without stopping the operation of the server or servers, this communication being ensured by a collaborative protocol without master/slave, before switching from an active mode where it is cooling to a backup mode where it is no longer cooling, the redundant cooling module verifying beforehand that a data set is consistent across all these cooling modules and that this consistency is maintained for a predetermined duration.

28 Claims, 5 Drawing Sheets

(51) Int. Cl.
  *G06F 13/42* (2006.01)
  *H05K 7/14* (2006.01)
  *H04L 12/40* (2006.01)
(52) U.S. Cl.
  CPC ....... *H05K 7/1498* (2013.01); *H05K 7/20272* (2013.01); *H05K 7/20281* (2013.01); *H05K 7/20781* (2013.01); *G05B 2219/50324* (2013.01); *G06F 2213/40* (2013.01); *H04L 2012/4026* (2013.01)
(58) Field of Classification Search
  CPC ...... G05B 19/4155; G05B 2219/50324; G06F 13/42; G06F 2213/40; H04L 2012/4026
  See application file for complete search history.

(56) References Cited

U.S. PATENT DOCUMENTS

| | | | | |
|---|---|---|---|---|
| 9,476,657 B1* | 10/2016 | Pettis | ...................... | F28F 27/02 |
| 2004/0250992 A1* | 12/2004 | Aoki | .................. | H05K 7/20727 |
| | | | | 165/80.3 |
| 2005/0174998 A1* | 8/2005 | Vesterinen | .......... | H04L 61/6004 |
| | | | | 370/354 |
| 2005/0225936 A1* | 10/2005 | Day | ................... | H05K 7/20754 |
| | | | | 361/679.47 |
| 2006/0271810 A1* | 11/2006 | Hsu | ..................... | G06F 11/2038 |
| | | | | 714/4.11 |
| 2011/0016893 A1* | 1/2011 | Dawes | ..................... | F25B 49/02 |
| | | | | 62/89 |
| 2014/0153924 A1* | 6/2014 | deRuijter | ............. | H04B 10/275 |
| | | | | 398/58 |
| 2014/0202678 A1* | 7/2014 | Goth | ....................... | F28F 27/02 |
| | | | | 165/287 |
| 2014/0317440 A1* | 10/2014 | Biermayr | ........... | G06F 11/2007 |
| | | | | 714/4.11 |
| 2015/0098180 A1* | 4/2015 | Berghe | ...................... | G06F 1/20 |
| | | | | 361/679.48 |
| 2015/0280971 A1* | 10/2015 | Xu | .......................... | H04L 69/40 |
| | | | | 370/225 |
| 2016/0124459 A1* | 5/2016 | Armbruster | ............... | H04J 3/14 |
| | | | | 709/248 |
| 2016/0128239 A1* | 5/2016 | Mulcahy | ........... | H05K 7/20927 |
| | | | | 363/141 |
| 2016/0226301 A1* | 8/2016 | Lee | ......................... | H02J 9/061 |
| 2016/0291656 A1* | 10/2016 | Jenne | ........................ | G06F 1/26 |
| 2017/0163521 A1* | 6/2017 | Hu | ........................ | H04W 40/34 |

* cited by examiner

PROTOCOL FOR COMMUNICATION BETWEEN A PLURALITY OF LIQUID COOLING MODULES FOR COMPUTER SERVERS

FIELD OF THE INVENTION

The invention relates to the field of communication protocols between a plurality of liquid cooling modules of a cooling system for one or more computer servers generally contained within the same server cabinet.

BACKGROUND OF THE INVENTION

According to the prior art, it is known to use a liquid cooling system comprising two liquid cooling modules, the first module in operation and the second module inactive but ready to take over in case of failure of the first module. This cooling system, which operates in 1+1 redundancy, is relatively simple and robust. Its effectiveness is limited, however. With good-sized liquid cooling modules, only a total of 80 kW can be dissipated in a server cabinet.

SUMMARY OF THE INVENTION

The object of the present invention is to provide a server cabinet which at least partially overcomes the abovementioned disadvantages.

More particularly, the invention aims to provide a server cabinet in which the cooling system offers a better compromise between the space required within the server cabinet and the robustness in case of failure of one of the cooling modules during operation, in a manner that is less disruptive to the operation of the server cabinet in order to avoid degrading its computing performance.

According to the invention, the aforementioned prior art poses the following dilemma. In a first option, redundancy of the modules is preserved, and the cooling system is robust in case of failure; however, it becomes necessary to over-engineer it significantly for cooling in normal mode, because a cooling module as large as the one that cools the entire server cabinet remains inactive and therefore not in use. In a second alternative option, the redundancy of the modules is not preserved, and the cooling system can be appropriately engineered for cooling in normal mode; however, this cooling system is sensitive to failure of even a single cooling module, as such failure would then automatically result in a significant drop in cooling capacity, which is halved, quickly requiring the complete shutdown of the associated server cabinet.

According to the invention, improving the abovementioned prior art has been considered by increasing to a redundancy of at least 2+1, meaning at least three cooling modules of which at least two are cooling constantly and the third remains inactive but ready to take over in case of failure of either of the other two cooling modules that are in operation. A master/slave architecture was considered. Although this architecture is robust in case of failure of a slave module, it remains sensitive to failure of the master module, the latter again constituting a weak link in the cooling system. Moreover, it is necessary to have on hand an inventory of a number of replacement master cooling modules in addition to slave cooling modules.

The invention therefore proposes retaining multiple cooling modules which are advantageously interchangeable, all of them cooling except one which is inactive so that it can take over in case of failure of any of the cooling modules that are in operation. The cooling modules then communicate with each other by a collaborative protocol, without master/slave, which eliminates the weak link while compensating for the failure of a cooling module in operation as well as ensuring its replacement on site without shutting down either the cooling system or the corresponding server cabinet, while occupying less total space inside the server cabinet. According to the invention, this collaborative protocol is accompanied by a greater autonomy of each cooling module, as the module will now have to perform tasks it did not previously perform. When the cooling modules are interchangeable, this also reduces the number of types of replacement cooling modules to keep on hand.

According to a preferred embodiment of the invention, this relates to cooling at least 120 kW with 2+1 redundancy. Three modules with a capacity of 60 kW each are sufficient instead of the two modules with a capacity of 120 kW each of the third prior art. The savings in required space in the server cabinet are significant. There is therefore no master controller, so cooling management is not centralized and does not become a critical point. The decentralization adopted by the invention leads to using a collaborative operational protocol, therefore with no master/slave, where all the cooling modules communicate at the same level with no hierarchical relationship between them: they are therefore all equal.

This decentralization will lead to a more robust cooling system in case of failure. However, unlike a highly hierarchical master/slave communication, if multiple cooling modules communicate with each other on an equal footing by means of a collaborative protocol, none being the master of another module which would be its slave, the risk may arise of inconsistency or incomprehension in this non-hierarchical communication between cooling modules, which could cause premature state changes for any of the cooling modules, under certain conditions possibly causing instability in the cooling system of the server cabinet as a whole. To reduce this risk of instability, a step of verifying the consistency of certain data is explicitly provided before some state changes, also accompanied by verification of the stability of this consistency over time, when the consistency is observed at least on an ad-hoc basis.

This double extra precaution of verifying consistency and verifying the stability of this consistency over time, retains all its flexibility in the collaborative protocol and much of its effectiveness, while reducing or eliminating the risk of deviation or instability in the general cooling system at the server cabinet that would arise from undesired or at least premature state changes in one or more cooling modules of the server cabinet. Among the possibilities for undesired or at least premature state changes in one or more cooling modules of the server cabinet, is in particular the premature transition of a cooling module to the redundant cooling module state, meaning inactive, which according to the invention poses the most critical risk for cooling system instability. The invention in effect looks for a redundancy of a cooling module, in other words its inactivation, that can remain stable over time and last for a fairly long period of time without interruption, in order to maintain a more efficient redundancy. If the cooling module that is redundant, therefore inactive, spends its time oscillating between inactive and operating, this is not much better than if it remained in operation the entire time.

To this end, the present invention provides a method of communication between a plurality of liquid cooling modules of a cooling system for one or more computer servers, characterized in that: the cooling modules communicate with each other in a manner that operates in N+1 redundancy where N is greater than or equal to 2, so as to enable a standard replacement of any one of these cooling modules without stopping the cooling and without stopping the operation of the server or servers, this communication being ensured by a collaborative protocol without master/slave, before switching from an active mode where it is cooling to an inactive mode where it is no longer cooling, the redundant cooling module verifying beforehand that a data set is consistent across all these cooling modules and that such consistency is maintained for a predetermined duration.

According to preferred embodiments, the invention comprises one or more of the following features which may be used separately or in combination.

Preferably, the cooling modules communicate with each other over an Ethernet network. This Ethernet network is very well suited for these local communications where simple messages are exchanged between cooling modules within a cabinet.

Preferably, this Ethernet network is also the network that carries external commands to the computer servers and is the general network of the computer cluster grouping multiple server cabinets which can participate in executing a same computing task. The existing Ethernet network is thus made more cost-effective, and it is not necessary to increase the complexity of the cooling system by adding an additional dedicated network.

Preferably, during an initialization phase, each cooling module broadcasts at least its identifier and an identifier of the server cabinet in which it is located. The various cooling modules of a same group located within a same server cabinet can thus be sure of quickly establishing contact with other cooling modules of the group which they do not yet know about.

Preferably, during this initialization phase, each cooling module having received the identifier of another cooling module located in the same server cabinet as itself, sends back a targeted message acknowledging receipt and communicating its own identifier and an identifier of their common server cabinet, so as to form an information exchange group isolated from the other cooling modules belonging to other information exchange groups. The various cooling modules of a same group located in a same server cabinet can thus establish intra-group communication with all cooling modules concerned without interference from the cooling modules of other groups.

Preferably, after completion of this initialization phase, each cooling module periodically sends, with a refresh period, its data to the other cooling modules of the information exchange group it has identified. All cooling modules of a same server cabinet thus have up-to-date knowledge, possibly near real-time, of the data of the other cooling modules of the server cabinet, which improves and streamlines communication between modules, especially because this communication is based on a collaborative protocol for which it is even more useful for the cooling modules to have up-to-date data whenever possible.

Preferably, each of the cooling modules can have at least the following two statuses: in active mode, an autonomous status in which the cooling module is cooling properly but fails to synchronize with all the other cooling modules; and again in active mode, a regulated status in which the cooling module is cooling properly and is able to synchronize with all the other cooling modules. The existence of these two modes of operation thus improves the general operation of the cooling system, by allowing effective although not optimized cooling in the absence of synchronization between the cooling modules and thus still enabling the computer servers of the server cabinet to operate, and by providing optimized cooling in the presence of synchronization between the cooling modules which will enable a cooling module to switch to redundancy, in other words to inactive, under optimum conditions.

Preferably, each of the cooling modules can have at least the following two statuses: in case of failure, a failed status in which the cooling module has stopped cooling properly when it should be continuing to cool properly; in backup mode, a redundant status in which the cooling module is inactive but remains ready to immediately replace another cooling module if that one fails. A failed status of one of the cooling modules will alert the other cooling module in redundant status, allowing it to replace the former in sufficient cooling of the computer servers of the server cabinet.

Preferably, when a cooling module switches to failed status, it itself shuts down its pump for circulating fluid coolant in the secondary hydraulic circuit. In the absence of a master cooling module, each cooling module has additional tasks it must perform on its own to ensure better operation of the cooling system as a whole.

Preferably, when one of the cooling modules successfully reaches autonomous status at the start, the server cabinet is started up as are the computer servers it contains. The server cabinet thus begins to operate very quickly while verifying that minimal cooling is already available, in order to avoid an emergency shutdown of a server cabinet that is starting up but does not have sufficient cooling.

Preferably, the cooling modules each have a set of parameters comprising: a redundant cooling module parameter pointing to the identifier of the cooling module authorized to switch to redundant status at the next favorable opportunity, at least one cooling regulation parameter pointing to a setpoint for a parameter regulating the cooling. With at least these few useful parameters, the cooling modules thus each have a more complete status report for the cooling system.

Preferably, the cooling regulation parameter is the target temperature of the fluid coolant in the secondary hydraulic circuit as it exits the heat exchanger. This parameter is especially representative of the proper operation of the cooling system, better ensuring that the temperature of the computer servers is not approaching the permissible limit.

Preferably, each cooling module has a consistency indicator which is positive when the following three conditions are met simultaneously: said cooling module has received values from all the other cooling modules, for at least the redundant cooling module parameter and the cooling regulation parameter, updated within a first predetermined duration, all received values for the redundant cooling module parameter being equal to its own value for the redundant cooling module parameter, for more than a second predetermined duration, all received values for the cooling regulation parameter being equal to its own value for the cooling regulation parameter for more than a third predetermined duration; which is negative if at least one of those three conditions is not met, said cooling module only switching from autonomous status to regulated status when its consistency indicator becomes positive. It is this consistency indicator that enables all the cooling modules to verify in a simple and efficient manner that their synchronization has been achieved, and that favorable conditions for optimizing the switch to redundancy for one of them should soon be met.

Preferably, the first duration is at least twice the period of data refresh by the cooling modules, the first duration preferably being between 1 and 10 seconds, more preferably between 2 and 10 seconds. These durations increase the responsiveness of the cooling system in case of drift, without significantly increasing the risk of instability in the cooling regulation loop.

Preferably, the second and third durations are between 5 and 60 seconds, more preferably between 10 and 60 seconds, the second and third durations advantageously being equal. These durations increase the responsiveness of the cooling system in case of drift, without significantly increasing the risk of instability in the cooling regulation loop.

Preferably, when a cooling module is no longer communicating its data to the other cooling modules, its data stored in memory are no longer taken into account in evaluating the consistency indicators of the other cooling modules. Communication between cooling modules and their decisions made in association with the communicated data are thus no longer contaminated by obsolete data no longer corresponding to the actual state of the cooling module they are supposed to represent.

Preferably, each cooling module has a stability indicator which is positive when the following three conditions are met simultaneously: the consistency indicators of all the cooling modules have been positive for at least a fourth duration, preferably greater than the first, second, and third durations, no cooling module has received any cooling malfunction alarm, at most one of the cooling modules is in redundant status, all cooling modules or all other cooling modules are in regulated status; and which is negative if at least one of these three conditions is not met; said cooling module only switching from regulated status to redundant status when the following two conditions are met simultaneously: its redundant cooling module parameter points to its own cooling module identifier, its stability indicator becomes positive. It is this stability indicator that enables all cooling modules to verify both efficiently and easily not only that their synchronization has been achieved but also that this synchronization remains stable over time, and that the expected favorable conditions for optimizing the switch to redundancy for one of them are met.

Preferably, the fourth duration is longer than 1 minute, preferably between 2 and 5 minutes. These durations increase the responsiveness of the cooling system in case of drift, without significantly increasing the risk of instability in the cooling regulation loop.

Preferably, if all cooling modules remain in autonomous status for at least a fifth predetermined duration, then intervention by an operator outside the server cabinet occurs, this fifth duration preferably being greater than 10 minutes. Indeed, if the cooling modules have all reached autonomous status, this means they are able to operate, but if they fail to synchronize within a reasonable time, it is likely that a problem exists at another level and is therefore difficult to resolve with only the cooling modules; operator intervention, which one tries to minimize because of its cost, then becomes very useful and therefore worth the expenditure.

Preferably, when a cooling module switches to failed status, its data are no longer taken into account in evaluating the consistency indicators of the other cooling modules. Communication between cooling modules and their decisions made in association with the communicated data are no longer contaminated by obsolete data no longer corresponding to the actual state of the cooling module they are supposed to represent.

Preferably, the data sent by each cooling module to the other cooling modules comprise: an identifier of its group of cooling modules intended to communicate with each other and located in a same server cabinet, together cooling a group of servers located in this server cabinet; its own cooling module identifier, the value of its redundant cooling module parameter; the value of its cooling regulation parameter; a boolean parameter corresponding to the presence or absence of a cooling malfunction alarm. With at least these few useful parameters and by exchanging their values, the cooling modules thus each have an even more complete status report for the cooling system.

Preferably, the refresh period is between 0.5 and 2 seconds. This duration improves the responsiveness of the cooling system in case of drift, without significantly increasing the risk of instability in the cooling regulation loop.

Preferably, when one of the cooling modules switches to failed status, then: its redundant cooling module parameter points to its own cooling module identifier: a command is sent to the other cooling modules to point their redundant cooling module parameter to the identifier of this failed cooling module; the cooling module which is in redundant status switches to regulated status or autonomous status; and the supply of power to all functional elements of this failed cooling module, with the exception of its circuit control board, is disabled. Thus, the handover between the failed cooling module and the redundant cooling module that is to replace it is made more smooth.

Preferably, when one of the cooling modules switches to failed status, it can then switch to excluded status, and then: a specific command from the operator dictates the exclusion of this cooling module, a specific command from the operator dictating the inclusion of this cooling module being required to restart the excluded cooling module, a simple reboot of its circuit control board not enabling said restart.

Preferably, when one of the cooling modules leaves excluded status, then: a specific command from the operator dictates the inclusion of this cooling module, and the power to all functional elements of this failed cooling module is reactivated.

As the exclusion decision was made explicitly, in order to include the corresponding cooling module once again in the operating cooling system, it is safer and more secure to require an explicit decision here as well in order to reduce the risk of instability in the general cooling system.

Preferably, when one of the cooling modules switches to autonomous status or regulated status or redundant status, it can then proceed directly to excluded status without passing through failed status, and then: a specific command from the operator dictates the exclusion of this cooling module, a specific command from the operator dictating the inclusion of this cooling module being required to restart the excluded cooling module, a simple reboot of its circuit control board not enabling said restart. In addition to failure, other types of malfunction posing a threat to the general cooling system may result in the exclusion of the cooling module subject to these other types of malfunction.

Other features and advantages of the invention will become apparent from reading the following description of a preferred embodiment of the invention, given as an example and with reference to the accompanying drawings.

Another object of the invention aims to provide a server cabinet in which the cooling system offers a better compromise between the space required space in the server cabinet and the robustness in case of failure of one of the cooling modules that is in operation, in a manner that is less disruptive to the operation of the server cabinet in order to avoid degrading its computing performance.

According to this other object of the invention, air cooling is not used because it is inherently limited by the heat capacity of air which is significantly lower than that of a liquid coolant. With a computer cluster grouping a large number of server cabinets at a high density, each server cabinet containing a significant number of computer servers stacked at a high density, the cooling performance requirements seem too high to be met by air cooling.

According to this other object of the invention, water cooling with components relocated to outside the cabinet is not retained because this requires shared elements that are large in size, such as coolant circulation pumps, which can present two disadvantages. The first disadvantage lies in the fact that these large elements occupy significant space, which can become critical in a computer cluster grouping a large number of server cabinets at a high density, each server cabinet containing a significant number of computer servers stacked at a high density. The second disadvantage lies in the fact that in case of failure, these shared elements can turn out to be weak links in the general system because they are shared. Not only will these elements need to be shut down, but also all server cabinets that depend on these failed elements for cooling, and of course all their computer servers, which can cause a serious drop in computing performance for the computer cluster if some of the elements of its computer cooling system fail.

According to this other object of the invention, water cooling with two cooling modules in 1+1 redundancy poses the following dilemma. In a first option, the redundancy of the modules is preserved, and the cooling system is robust in case of failure; however, it becomes necessary to over-engineer it significantly for cooling in normal mode, because a cooling module as large as the one cooling the entire server cabinet remains inactive and therefore not in use. In a second alternative option, the redundancy of the modules is not preserved, and the cooling system can be appropriately engineered for cooling in normal mode; however, this cooling system is sensitive to failure of even a single cooling module, as such failure would then automatically result in a significant drop in cooling capacity, which is divided in half, quickly requiring a complete shutdown of the associated server cabinet.

According to this other object of the invention, improving the 1+1 redundancy by increasing the redundancy to at least 2+1 was considered, meaning at least three cooling modules of which at least two are cooling constantly and the third remains inactive but ready to take over in case of failure of either of the two cooling modules that are in operation. A master/slave architecture was considered. Although this architecture is robust in case of failure of a slave module, it remains sensitive to failure of the master module, the latter again constituting a weak link in the cooling system. Moreover, it is necessary to have on hand an inventory of a number of replacement master cooling modules in addition to slave cooling modules.

This other object of the invention then proposes retaining multiple cooling modules which are advantageously interchangeable, all of them cooling except one which is inactive so that it can take over in case of failure of any of the cooling modules that are in operation. These cooling modules then communicate with each other by a collaborative protocol, without master/slave, which eliminates the weak link while compensating for the failure of a cooling module in operation as well as ensuring its replacement on site without shutting down either the cooling system or the corresponding server cabinet, while occupying less total space inside the server cabinet According to this other object of the invention, this collaborative protocol is accompanied by greater autonomy of each cooling module, as each one will now have to perform tasks it did not perform before. When the cooling modules are interchangeable, this also reduces the number of types of replacement cooling modules to keep on hand.

According to a preferred embodiment of this other object of the invention, it relates to cooling at least 120 kW with 2+1 redundancy, for computer servers of a same server cabinet. Three modules with a capacity of 60 kW each are sufficient instead of the two modules with a capacity of 120 kW each in the 1+1 redundancy. The savings in occupied space in the server cabinet are significant. There is therefore no master controller, so cooling management is not centralized and does not become a critical point. The decentralization adopted in this other object of the invention leads to using a collaborative operational protocol, therefore without master/slave, where all the cooling modules communicate at the same level with no hierarchical relationship between them; they are therefore all equal.

To this end, this other object of the invention provides a server cabinet comprising: at least one computer server, and at least one liquid cooling module for that server, wherein: the cabinet comprises at least three liquid cooling modules communicating with each other by a collaborative protocol without master/slave, operating in N+1 redundancy where N is greater than or equal to 2, so as to enable a standard replacement of any one of these cooling modules without stopping the cooling of the server cabinet and without stopping the operation of the server located in the server cabinet, each of these liquid cooling modules comprising its own cooling regulation and failure detection system.

To this end, this other object of the invention also provides a cooling system comprising at least one liquid cooling module for at least one computer server located in a server cabinet, wherein: the cabinet comprises at least three liquid cooling modules located in the server cabinet and communicating with each other by a collaborative protocol without master/slave, operating with N+1 redundancy where N is greater than or equal to 2, so as to enable a standard replacement of any of these cooling modules without stopping the cooling of the server cabinet and without stopping the operation of the server located in the server cabinet, each of these liquid cooling modules comprising its own cooling regulation and failure detection system.

Thus, according to preferred embodiments of this other object of the invention, the liquid cooling module is interchangeable for maintenance without stopping the operation of the server cabinet or the computer servers that it contains. This liquid cooling module then has its own electronics for regulation and failure detection, with independent and collaborative operation between the liquid cooling modules of a same server cabinet, with no master controller for the server cabinet. This optimized redundancy reduces energy consumption, with n modules in operation and one inactive. The decision to set the redundant module to inactive is made on the basis of a collaborative algorithm, by all cooling modules of a same server cabinet.

According to preferred embodiments, this other object of the invention comprises one or more of the following features which may be used separately or in combination, with any of the other objects of the invention.

Preferably, the server cabinet comprises a secondary hydraulic circuit directly cooling the computer servers, and the liquid cooling modules are connected to the secondary hydraulic circuit in parallel with one another. This better ensures the independence of the different cooling modules in case of failure, without the need for bypass circuits which would add to the complexity of the cooling system.

Preferably, the server cabinet comprises a portion of primary hydraulic circuit intended for connection to a heat sink external to the server cabinet, and the liquid cooling modules are connected to this portion of primary hydraulic circuit in parallel with one another. This better ensures the independence of the different cooling modules in case of failure, without the need for bypass circuits which would add to the complexity of the cooling system.

Preferably, the server cabinet comprises a secondary hydraulic circuit which direct cools the computer servers, and the temperature of the liquid coolant in the secondary hydraulic circuit is between 20° C. and 45° C. This temperature range ensures the proper operation of most computer servers to be cooled.

Preferably, one of the cooling modules remains off during the majority of the cooling time, preferably during at least 90% of the cooling time. Redundancy is thus in full play, and if one of the other cooling modules fails, this module will be ready to take over with much less risk of also failing immediately afterwards.

According to a first alternative, it is always the same cooling module which remains inactive during the majority of the cooling time. If one of the other cooling modules fails, it will be like new and ready to take over with no risk of also failing immediately afterwards.

According to a second alternative, each of the cooling modules periodically takes turns in successively remaining inactive for the majority of the cooling time. If one of the other cooling modules fails, this module will be ready to take over with a relatively low risk of also failing immediately afterwards. All cooling modules of a same server cabinet will be used regularly and will exhibit a similar degree of wear, which can simplify management of the pool of cooling modules in a same computer room.

Preferably, all the cooling modules are cooling together during a minority of the cooling time, preferably only during an initialization phase and/or during a reset phase of the cooling modules and/or during a temporary malfunction of an external heat sink to which the server cabinet is connected by means of a portion of primary hydraulic circuit. Thus, not only can the redundant cooling module, meaning the inactive one, take over if one of the other cooling modules fails, but in case of adverse conditions when the other cooling modules, although not failing, are no longer able to ensure the desired level of cooling, the redundant cooling module can pitch in to help the other cooling modules which then all continue to operate. Preferably, the cabinet comprises at least 3 to 5 liquid cooling modules communicating with each other by a collaborative protocol without master/slave, operating with N+1 redundancy where N is between 2 and 4, so as to enable a standard replacement of any of these cooling modules without stopping the cooling of the server cabinet and without stopping the operation of the server located in the server cabinet. This moderate but sufficient number of cooling modules is a very good compromise between cooling efficiency in normal mode and robustness in case of failure.

Preferably, the liquid cooling modules communicate with each other on an equal basis, being subject only to a general administrator who manages a pool of server cabinets cooling a cluster of computer servers and who manages several other functions for this cluster of computer servers in addition to its cooling by the pool of server cabinets, including booting the cluster of computer servers and allocating tasks, for example computing tasks. This makes the cooling system more robust overall in case of failure, because it eliminates weak links, even at higher levels in the cluster architecture, while improving the autonomy of each of the cooling modules.

Preferably, each cooling module dissipates at least 50 kW of heat, preferably at least 60 kW. Thus, a simple 2+1 redundancy already ensures effective dissipation of a large amount of heat while not occupying too much space in the server cabinet.

Preferably, the server cabinet comprises a secondary hydraulic circuit directly cooling the computer servers, and the server cabinet comprises a portion of primary hydraulic circuit intended to be connected to a heat sink external to the server cabinet, a heat exchanger cooling the secondary hydraulic circuit by the primary hydraulic circuit, and the temperature differential between the outlet of the secondary hydraulic circuit and the inlet of the primary hydraulic circuit being between 0° C. and 6° C. The heat exchanger thus provides a good compromise between cooling efficiency and compact size in the cooling module.

Preferably, the cooling regulation and failure detection system of each cooling module comprises one or more temperature sensors, one or more pressure sensors, a water leak detector, a sensor detecting the position of the opening angle of the valve. This set of sensors ensures proper operation of the cooling module in normal cooling mode, while ensuring prompt response in the event of failure or malfunction.

Preferably, the cooling regulation and failure detection system of each cooling module comprises an actuator for the electric relay responsible for turning a pump of the cooling module on or off, and a valve actuator responsible for controlling the opening angle of the valve. These elements contribute to improving the autonomy of the cooling module.

Preferably, all the cooling modules are interchangeable, preferably identical. This reduces the number of types of replacement cooling modules to keep on hand.

Preferably, all the liquid cooling modules are located in the lower portion of the server cabinet, beneath all the computer servers. Thus, in case of a limited leak of coolant in a cooling module, there is no chance of the leaking liquid flowing onto one of the computer servers or disrupting operation.

Preferably, the fluid coolant circulating in the secondary hydraulic circuit has a residual pressure, when no longer being pumped, which is greater than 0.8 bar, preferably greater than 1.2 bar, more preferably greater than 2 bar. The risk of pump cavitation is thus reduced or even eliminated.

Preferably, the server cabinet comprises a portion of primary hydraulic circuit and a secondary hydraulic circuit located one on either side of a heat exchanger, a valve regulating the flow in the portion of primary hydraulic circuit, a temperature sensor in the secondary hydraulic circuit located at the outlet of the exchanger, said valve being controlled by said temperature sensor, preferably via a proportional/integrator/differentiator (PID) type of feedback control. This type of feedback control, which is simple and effective, is suitable and sufficient for properly regulating the cooling of a server cabinet.

Preferably, each liquid cooling module comprises its own heat exchanger, between a portion of primary hydraulic circuit and a secondary hydraulic circuit, and its own pump for circulating a fluid coolant in the secondary hydraulic circuit. The autonomy of the cooling module is thus improved.

Preferably, the only maintenance of the cooling system that is allowed on site, in the server cabinet, is the standard replacement of a cooling module which consists of removing the failed cooling module and replacing it with a spare cooling module without interruption of either the cooling or the operation of the computer server(s). This easier and more secure maintenance is made possible by the structure of the server cabinet and of its cooling system, based on autonomous and advantageously interchangeable cooling modules, proposed by this other object of the invention Yet another object of the invention is to provide an autonomous liquid cooling module, incorporating its own key components such as the pump circulating the liquid coolant in the secondary hydraulic circuit or the heat exchanger between the primary and secondary hydraulic circuits, which is sufficiently powerful and sufficiently compact to be integrated with sufficient cooling capacity and a reduced volume in a server cabinet that already contains a high density of computer servers thus leaving little room for liquid cooling modules, while also ensuring a sufficient level of ventilation for its critical component(s) such as its circuit control board, in order to reduce or even eliminate the risk of one of its sensitive components overheating.

For this purpose, this other object of the invention proposes a special arrangement of the most important and most voluminous components, relative to one another and to the airflow inside the outer housing which itself has a relatively flat geometry, while maintaining a sufficient level of ventilation in particular conveyed by this airflow, with a simplification of the topology of the secondary hydraulic circuit associated with this novel internal arrangement of the liquid cooling module.

This other object of the invention therefore provides a novel internal arrangement of the components and a simplification of the layout of the secondary hydraulic circuit in order to facilitate the passage of the airflow, so as to improve the compromise between compactness of the module, efficiency of its internal ventilation, and cooling capacity for the computer servers external to it.

To this end, this other object of the invention provides a liquid cooling module for computer servers, comprising an outer housing incorporating components, wherein: the outer housing has a length, a width, and a thickness such that the length is less than twice the width and the thickness is less than half the width; the outer housing has four side walls, two referred to as long walls in the lengthwise direction and two referred to as short walls in the widthwise direction, a bottom, and a cover; and wherein the module comprises among its incorporated components: a pump orientated in the lengthwise direction of the outer housing and positioned along a long side wall, a fan, a heat exchanger orientated in the lengthwise direction of the outer housing and positioned along the other long side wall, at least two ventilation grilles respectively positioned in the two short side walls, an open central longitudinal space between the pump and the heat exchanger that is arranged to facilitate airflow therein from a grille of one short side wall to a grille of the other short side wall, this airflow being driven by the fan, a portion of secondary hydraulic circuit located in the liquid cooling module, for circulating a fluid coolant, comprising no bypass that would allow the pump to operate as a closed circuit and which would clutter this open longitudinal space, a circuit control board positioned in the longitudinal extension of the open central longitudinal space so as to be directly swept by the airflow.

Preferably, the fluid coolant is a liquid coolant, for example glycol-water. The primary and secondary hydraulic circuits may also each contain different respective liquid coolants.

According to preferred embodiments, this other object of the invention comprises one or more of the following features, which may be used separately or in combination.

Preferably, said circuit board comprises two separable portions which are: a logic portion that is removable without disassembling the cooling module, and a connection portion fixed to the cooling module without being separately removable, all connections of the liquid cooling module components leading to said circuit board being connected to said connection portion (of the circuit board). Maintenance of the circuit board is thus facilitated, the majority of potential failures being likely to occur in the logic portion rather than in the connection portion. In a compact liquid cooling module, maintenance of the critical component constituted by the circuit board is usually difficult and often requires significant disassembly of the cooling module, with a complete opening of the outer housing requiring for example completely removing the cover from this outer housing or even having to disassemble other components from the outer housing.

Preferably, the thickness of the outer housing is less than one-third of the width of the outer housing. The outer housing is more flattened, and takes up less space. Advantageously, to house key components of sufficient power, the thickness of the outer housing is greater than one-sixth of the width of the outer housing, or even greater than one-fifth of the width of the outer housing: it is preferably about one-fourth of the width of the outer housing.

Preferably, the pump oriented in the lengthwise direction of the outer housing and positioned along a long side wall is arranged right next to this long side wall. This leaves the central longitudinal space more open, without decreasing the efficiency of the pump.

Preferably, the heat exchanger oriented in the lengthwise direction of the outer housing and positioned along the other long side wall is arranged close to the other long side wall without any other member between them except a pipe. This leaves the central longitudinal space more open, without decreasing the efficiency of the exchanger but leaving just enough space between this exchanger and this other long side wall for the width of a pipe of the secondary hydraulic circuit.

Preferably, said circuit board does not comprise a protective cover and is in direct contact with all the airflow coming from the open central longitudinal space. Ventilation of the circuit board is thus improved and additional space is saved. The simplification of the secondary hydraulic circuit greatly reduces the risk of liquid coolant leaking onto the circuit board.

Preferably, said circuit board dissipates at least 5 W of heat, more preferably at most 20 W, even more preferably between 7 and 10 W. Its ventilation requirements are therefore greater, and the internal arrangement of the liquid cooling module according to this other object of the invention is even more attractive.

The length of the outer housing is of course greater than its width which in turn is of course greater than its thickness. Preferably, the outer housing has a length between 60 and 90 cm, a width between 50 and 70 cm, a thickness between 10 and 20 cm, and more preferably has a length between 70 and 80 cm, a width between 55 and 65 cm, a thickness between 13 and 17 cm. This geometry of the outer housing favors a well-distributed arrangement of the main components, enabling a more open central longitudinal space for airflow. The outer housing has for example a length of 76 cm, a width of 59.5 cm, a thickness of 15 cm.

Preferably, the pump has sufficient capacity to provide a differential pressure between 2.5 and 3.5 bar at a flow rate between 50 and 100 liters per minute of fluid coolant.

Preferably, the cooling module dissipates at least 50 kW of heat, preferably at least 60 kW.

Thus, only two liquid cooling modules with an additional redundant module are sufficient to cool a server cabinet of conventional size and containing a good density of computer servers.

Preferably, the pump comprises an air guide which channels air between the air intake ventilation grille in the cooling module and the pump inlet. This prevents the direct reinjection into the pump inlet of air heated from flowing inside the outer housing of the module, which otherwise would result in less effective dissipation of the heat produced by the pump motor.

Preferably, the cooling module comprises a check valve located on the segment of secondary hydraulic circuit located between the pump outlet and the heat exchanger inlet. In case of failure of the liquid cooling module pump, this prevents forced circulation of liquid coolant in the portion of secondary hydraulic circuit of this module, driven by the pump or pumps of the other liquid cooling modules.

Preferably, the cooling module comprises a valve positioned on a portion of primary hydraulic circuit located in the cooling module, having the function of indirectly regulating the fluid coolant temperature in the secondary hydraulic circuit at the outlet from the heat exchanger, this valve preferably being a throttling ball valve. This is the main component of the liquid cooling module that manages the level of cooling produced by the module, by regulating the arrival of cold liquid coolant in the primary hydraulic circuit coming from the heat sink external to this liquid cooling module.

Preferably, one of the ventilation grilles is a first ventilation grille for the discharge of air from the cooling module and is located just downstream of said circuit board. Ventilation of the circuit board is thus facilitated, which is of interest because this is a critical component of the liquid cooling module, tending to release a lot of heat, especially if a powerful circuit board having multiple functions is chosen.

Preferably, one of the ventilation grilles is a second ventilation grille for the discharge of air from the cooling module and is located just downstream of said valve. Ventilation of the valve, which is another component tending to release a lot of heat, is thus also facilitated.

Preferably, the sum of the surface areas of the air discharge ventilation grille is equal to the surface area of the air intake ventilation grille. The flow of air is thus more fluid, as the air flows inside the outer housing of the module practically without loss of pressure.

Preferably, the heat exchanger is an exchanger lying on its side, preferably a plate heat exchanger, more preferably a cross-flow plate heat exchanger. Arranged in this manner, the naturally bulky heat exchanger fits easily into a rather flattened outer housing. The type of exchanger chosen optimizes the compromise between provided capacity and occupied volume.

Preferably, an outer insulation layer surrounds the heat exchanger and the pipe or pipes of a portion of primary hydraulic circuit located in the cooling module, so as to prevent condensation on their outer walls, even when the temperature of said outer walls is less than the dew point temperature of the cooling module. This reduces or even eliminates the risk of dripping condensation water which could have two disadvantages, namely damaging another component of the module or at least disrupting its operation, and also preventing the triggering of a false alarm at the leak detector advantageously comprised in the liquid cooling module.

Preferably, the cooling module comprises a liquid leak detector located in the bottom of the outer housing. This leak detector allows issuing an alarm in case of a coolant leak that could damage one or more components of the module or could at least affect their operation. This leak detector triggers an alarm, preferably only in case a significant leak; micro-leaks with no impact and that do not endanger the operation of the liquid cooling module are then advantageously ignored and the risk of a shutdown of the liquid cooling module for no valid reason is avoided.

Preferably, the fan is the pump fan and it is coupled to the electrically-powered shaft of the pump, the pump motor then being air-cooled. This pump fan thus fulfills two functions simultaneously: cooling the pump motor, the pipe portion of the pump being cooled by the passage of coolant, and driving or facilitating the driving of the air flow in the open central longitudinal space located inside the outer housing of the liquid cooling module. Alternatively, in the case for example where both the pump motor and the rest of the pump are cooled with water or some other liquid coolant, the pump then no longer having a fan, the flow of air may be facilitated by the fan of another component, a small fan added for this purpose, or more simply but less efficiently in certain cases by the natural convection of air between the intake and discharge grilles.

All the objects of the invention, as well as all their preferred embodiments, may be combined.

Other features and advantages of the invention and of the other objects of the invention will be apparent from reading the following description of a preferred embodiment of the invention, given as an example and with reference to the accompanying drawings.

DETAILED DESCRIPTION OF THE INVENTION

Figure 1:
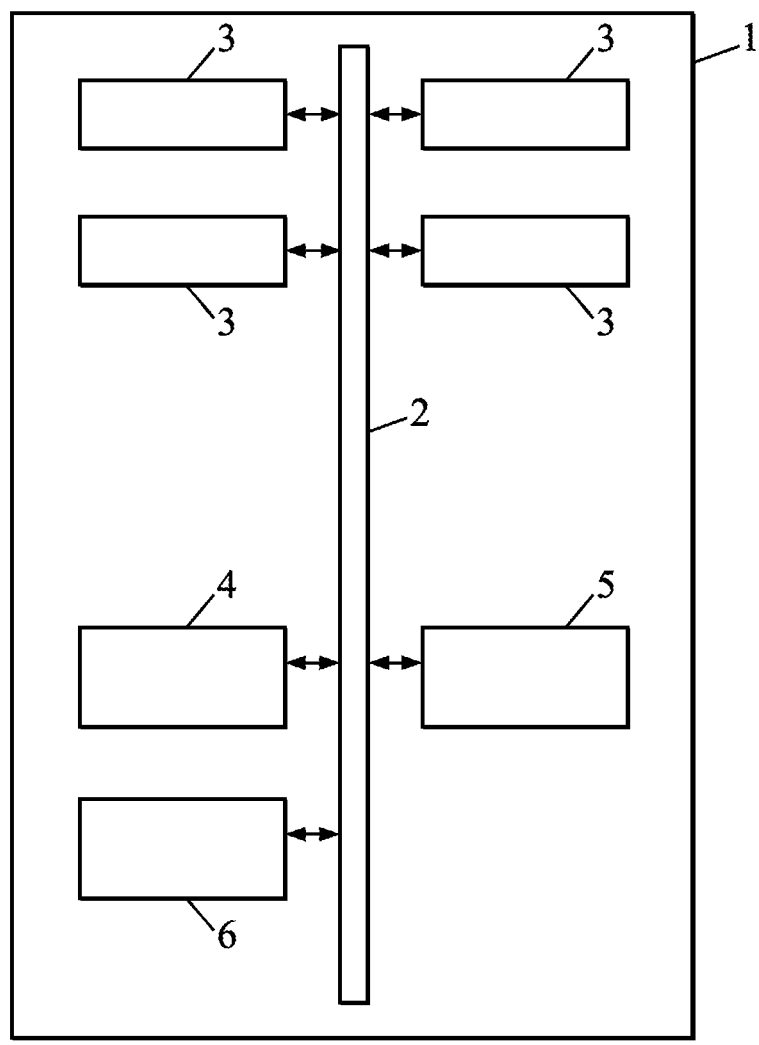
FIG. 1 very schematically represents an example of a server cabinet according to one embodiment of the invention.

FIG. 1 very schematically represents an example of a server cabinet according to one embodiment of the invention.

A server cabinet 1 contains an Ethernet bus 2 which one or preferably multiple computer servers 3 on the one hand and liquid cooling modules 4, 5, and 6 on the other hand use to communicate. For example, during the operation of computer servers 3 executing for example one or more computations separately or in cooperation with one another, cooling modules 4 and 5 are running and are cooling the computer servers 3, while cooling module 6 is redundant, meaning inactive but ready to take over and immediately replace one of the other cooling modules 5 or 6 if it becomes defective, without intervention by an operator outside the server cabinet 1.

The one or more computer servers 3 are mounted on a rack of the server cabinet 1 and are traversed by a secondary hydraulic cooling circuit conveying a fluid or a liquid coolant of high heat capacity, much greater than that of air, this fluid or liquid coolant coming from the running cooling modules, which are modules 4 and 5.

The Ethernet network 2 provides communication between the controllers of each of the cooling modules 4 to 6. A failure in this network 2 thus results in a degraded mode of operation of this otherwise robust cooling system, particularly in case of failure of one of the cooling modules 4 or 5, the redundant cooling module 6 immediately replacing the failed cooling module, for example module 4.

Figure 2:
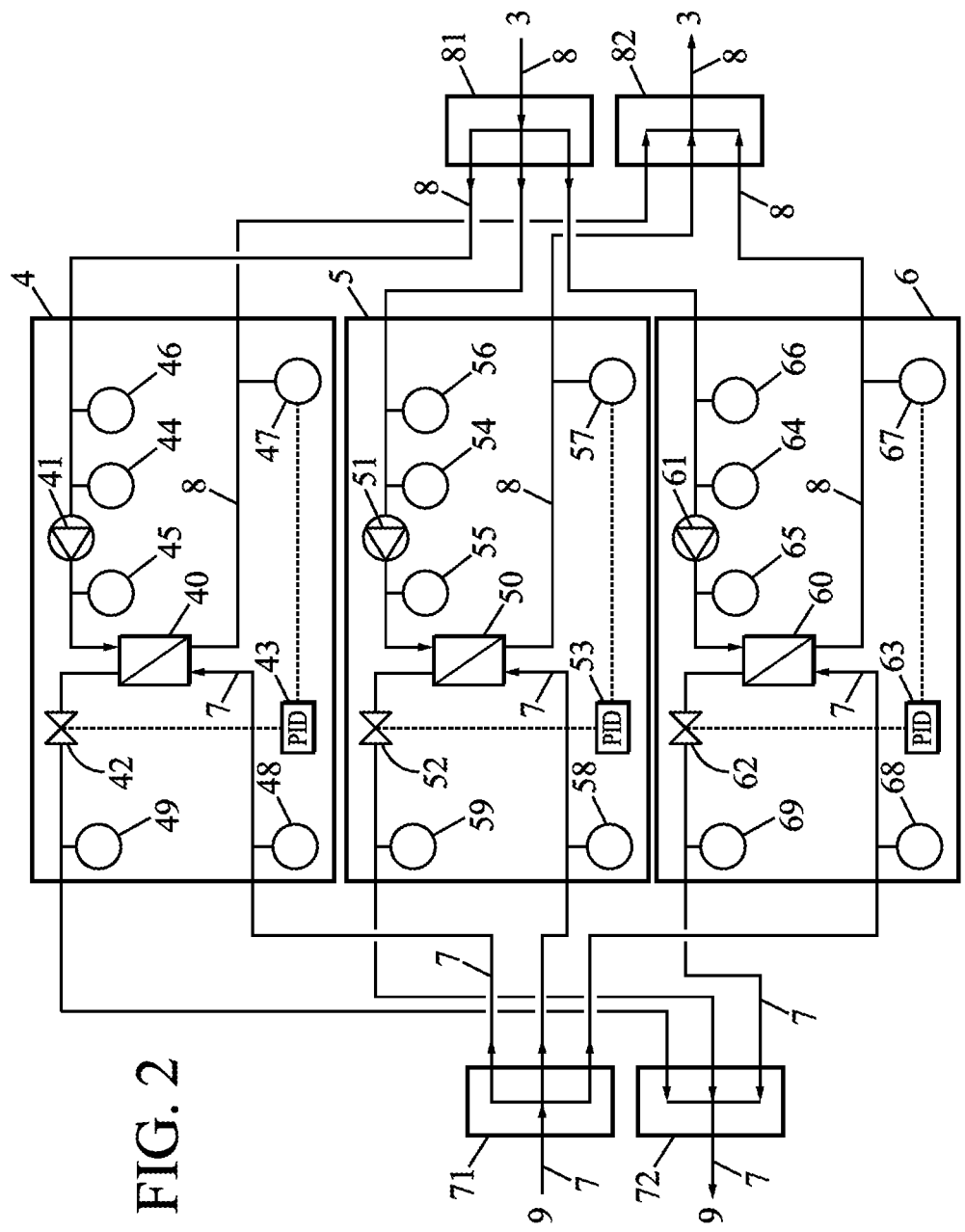
FIG. 2 schematically represents an example structure of the primary and secondary hydraulic circuits in the liquid cooling modules of a server cabinet according to one embodiment of the invention.

FIG. 2 schematically represents an exemplary structure of the primary and secondary hydraulic circuits in the liquid cooling modules of a server cabinet according to one embodiment of the invention.

A primary hydraulic circuit 7 supplies the three liquid cooling modules 4 to 6 with cold liquid coolant coming from a heat sink 9 external to the liquid cooling modules 4 to 6. The liquid cooling modules 4 to 6 return to this heat sink 9 the liquid coolant warmed by its passage through the liquid cooling modules 4 to 6. The heat sink 9 cools down this liquid coolant, and the coolant then starts another passage through the primary hydraulic circuit 7. The primary hydraulic circuit 7, coming from the heat sink 9, is divided by a flow splitter 71 into three branches of primary hydraulic circuit 7 which are parallel to one another and respectively pass through the three liquid cooling modules 4 to 6. At the outlet of the three liquid cooling modules 4 to 6, a coupler 72 recombines these three mutually parallel branches of the primary hydraulic circuit 7 to reform the primary hydraulic circuit 7 heading towards the heat sink 9.

These three liquid cooling modules 4 to 6 in turn supply the computer servers 3 with cooled fluid coolant. The computer servers 3 send back to the liquid cooling modules 4 to 6 the liquid coolant warmed by the thermal energy dissipated by these computer servers 3 and carried away by the liquid coolant. The liquid cooling modules 4 to 6 cool this liquid coolant back down, and the coolant then starts another passage through the secondary hydraulic circuit 8. The secondary hydraulic circuit 8, coming from the computer servers 3, is divided by a flow splitter 81 into three branches of the secondary hydraulic circuit 8 which are parallel to one another and respectively pass through the three liquid cooling modules 4 to 6. At the outlet of the three liquid cooling modules 4 to 6, a coupler 82 recombines these three mutually parallel branches of the secondary hydraulic circuit 8 to reform the secondary hydraulic circuit 8 heading towards the computer servers 3.

The primary hydraulic circuit 7 and secondary hydraulic circuit 8 are not in fluid contact, in other words the liquid coolants of these two hydraulic circuits do not mix together. The primary hydraulic circuit 7 and secondary hydraulic circuit 8 are in thermal contact, meaning that the liquid coolants of these two hydraulic circuits exchange heat with each other as they pass through the heat exchangers 40, 50, and 60 of the liquid cooling modules 4 to 6.

Cooling module 4 comprises a heat exchanger 40, a pump 41, a valve 42, a PID (proportional-integrator-differentiator) controller 43, an upstream pressure sensor 44, a downstream pressure sensor 45, a secondary upstream temperature sensor 46, a secondary downstream temperature sensor 47, a primary upstream temperature sensor 48, a primary downstream temperature sensor 49.

The cold liquid coolant of a branch of the primary hydraulic circuit 7 enters the liquid cooling module 4, passes through the heat exchanger 40 where it is warmed by the exchange of heat with the hot liquid coolant of a branch of the secondary hydraulic circuit 8, travels through the valve 42 where the opening regulates its flow through the liquid cooling module 4, then exits the liquid cooling module 4. The temperature of this cold liquid coolant is measured just after it enters the liquid cooling module 4, by the primary upstream temperature sensor 48. The temperature of this warmed liquid coolant is measured just before it leaves the liquid cooling module 4, by the primary downstream temperature sensor 49. The pumping of the liquid coolant in the primary hydraulic circuit 7 is carried out by one or more pumps located outside the liquid cooling modules 4 to 6, and possibly shared by liquid cooling modules of several different server cabinets. The temperatures measured by the primary temperature sensors 48 and 49 are used to verify the proper operation of the primary hydraulic circuit 7.

The hot liquid coolant of a branch of the secondary hydraulic circuit 8 enters the liquid cooling module 4, is forced on by the pump 41, passes through the heat exchanger 40 where it is cooled by the exchange of heat with the cold liquid coolant of a branch of the primary hydraulic circuit 7, then exits the liquid cooling module 4.

The temperature of this hot liquid coolant is measured just after it enters the liquid cooling module 4, by the secondary upstream temperature sensor 46. The temperature of this warmed liquid coolant is measured just before it exits the liquid cooling module 4, by the secondary downstream temperature sensor 47. The temperatures measured by the secondary temperature sensors 46 and 47 are used to verify the proper operation of the secondary hydraulic circuit 8. The secondary circuit 8 enables the circulation of the cooling liquid or liquid coolant, within the loop internal to the server cabinet, at a temperature between 20° C. and 45° C. Temperature sensor 47 is suitable for measuring the temperature at the outlet of the secondary hydraulic circuit 8 of the cooling module 4, the flow rate of the liquid coolant of the primary hydraulic circuit 7 being maintained at a rate chosen so that the temperature at the outlet of the secondary hydraulic circuit 8 is equal to a threshold temperature. The temperature at the inlet to the secondary cooling circuit 8 which passes through the computer servers 3, as measured by the secondary upstream temperature sensor 46, is kept constant in order to optimize the cooling of the electronic components of their blades. The temperature regulation is independent for each of the liquid cooling modules 4 to 6, to ensure a constant temperature at the inlet to the computer servers regardless of their heat dissipation.

The primary hydraulic circuit 7 concerns circuits connected to the hydraulic system of the infrastructure of the client using the computer cluster containing all the server cabinets for example in a computer room, and the secondary hydraulic circuit 8 concerns hydraulic circuits connected to the cooling circuit of the server cabinet. The cooling module 4 comprises a portion of primary hydraulic circuit 7 having an outlet suitable for connection to the inlet of a client primary hydraulic system and an inlet suitable for connection to the outlet of the client primary hydraulic system 7. The cooling module 4 also comprises a portion of secondary hydraulic circuit 8 having an outlet connected to the inlet of the secondary cooling circuit 8 of the server cabinet and an inlet connected to the outlet of the secondary cooling circuit 8 of the server cabinet.

Furthermore, in the server cabinet, the inlet and outlet of the primary hydraulic circuit 7 of each cooling module 4 to 6 are provided with anti-drip quick connectors for easily connecting and disconnecting the portion of primary hydraulic circuit 7 of the cooling modules 4 to 6 to the rest of the primary hydraulic system 7 of the computer room of the computer cluster.

The pressure of the liquid coolant in the branch of the secondary hydraulic circuit 8 is measured just upstream of the pump 41 by the upstream pressure sensor 44, and just downstream of the pump 41 by the downstream pressure sensor 45, in order to control the proper operation of the pump 41, and in order to be able to stop the pump 41 if it malfunctions. The pump 41 has sufficient capacity to circulate the secondary cooling liquid in the inner loop at a pressure of about 3 bar at a flow rate of about 75 liters per minute of secondary cooling liquid which is for example glycol-water. The pump 41 supplies a constant flow without vibration-generating pressure fluctuations, due to the shape of the pipe channels of the portion of secondary hydraulic circuit 8 located in the cooling module 4. The pump 41, which is able to control the flow rate of fluid coolant in the secondary hydraulic circuit 8, is associated with control means suitable for controlling this pump 41. The liquid coolant in the secondary cooling circuit 8 preferably has a static pressure greater than or equal to 2 bar. By keeping this liquid coolant under pressure, the pump 41 is protected from cavitation, and the cooling system of the server cabinet is able to operate even in the event of leakage.

The inlet and the outlet of the secondary hydraulic circuit 8 of each cooling module 4 to 6 are provided with anti-drip quick connectors for easily connecting and disconnecting the portion of secondary hydraulic circuit 8 of the cooling modules 4 to 6 to the rest of the secondary hydraulic circuit 8 of the server cabinet cooling the computer servers 3.

In the exchanger 40, 60 kW of heat are exchanged between the secondary hydraulic circuit 8 which supplies it and the primary hydraulic circuit 7 which absorbs it, by means of a plate heat exchanger 40 of sufficient size to exchange this amount of heat with similar or identical flow rates, or at least of the same order of magnitude, on both sides and an approach temperature of 4° C., this approach temperature corresponding to the difference between the external upstream temperature measured by the primary upstream temperature sensor 48 and the internal downstream temperature measured by the secondary downstream temperature sensor 47. The heat exchanger 40 is able to cool the fluid coolant passing through the secondary hydraulic circuit 8 by dissipating heat through the primary hydraulic circuit 7.

The controller 43 regulates the opening of the valve 42, and therefore the flow rate of the liquid coolant of the primary hydraulic circuit 7 in the liquid cooling module 4, according to the temperature of the liquid coolant of the secondary hydraulic circuit 8 at the outlet of the liquid cooling module 4, measured by the secondary downstream temperature sensor 47.

The liquid cooling module 4 also comprises means for controlling the proper operation of the module 4 and for failure detection, as well as means for controlling the temperature regulation of the fluid coolant passing through the secondary hydraulic circuit 8, which in particular are the various temperature and pressure sensors associated with a circuit board represented in FIG. 6 below. The circuit control board of each liquid cooling module is cooled by the fan responsible for cooling the motor of the pump of this liquid cooling module.

Cooling module 5 comprises a heat exchanger 50, a pump 51, a valve 52, a PID (proportional-integrator-differentiator) controller 53, an upstream pressure sensor 54, a downstream pressure sensor 55, a secondary upstream temperature sensor 56, a secondary downstream temperature sensor 57, a primary upstream temperature sensor 58, a primary downstream temperature sensor 59. Cooling module 5 is identical to cooling module 4. Cooling module 5 operates identically to cooling module 4.

Cooling module 6 comprises a heat exchanger 60, a pump 61, a valve 62, a PID (proportional-integrator-differentiator) controller 63, an upstream pressure sensor 64, a downstream pressure sensor 65, a secondary upstream temperature sensor 66, a secondary downstream temperature sensor 67, a primary upstream temperature sensor 68, a primary downstream temperature sensor 69. Cooling module 6 is identical to cooling module 4. Cooling module 6 operates identically to cooling module 4.

The three cooling modules 4 to 6 can operate in basic redundancy, in other words with three active modules with transitioning to two active modules upon the failure or removal of one of these modules. The special operating mode, for example for use during initialization of the cooling system, operates in basic redundancy.

The three cooling modules 4 to 6 can operate in optimized redundancy, in other words with two active modules 4 and 5 and one module 6 in reserve, ready to start up if one of the two active modules 4 or 5 is shut off after a failure or removal of the module. The normal or steady state operating mode operates in optimized redundancy.

This operation in basic redundancy and/or optimized redundancy can of course be generalized to n liquid cooling modules, where n is then strictly greater than two.

There is no interruption in service during startup or shutdown of one of the n liquid cooling modules. Each of the n liquid cooling modules is removable in order to perform maintenance without stopping the cooling of the computer servers 3 present in the server cabinet.

Regulation and failure detection is carried out by monitoring the temperature sensors 46 to 49, 56 to 59, or 66 to 69, and pressure sensors 44 and 45, or 54 and 55, or 65 and 66, by means of a circuit board specific to each cooling module 4, 5, or 6.

The dialog between the boards of the three liquid cooling modules 4 to 6 takes place using TCP ("Transmission Control Protocol/Internet Protocol") or UDP ("User Datagram Protocol"). The three liquid cooling modules 4 to 6 also send messages using the SNMP ("Simple Network Management Protocol") standard, to a general system for monitoring the cabinet and managing the computer room containing multiple server cabinets. There is no master/slave system between the three liquid cooling modules 4 to 6, since the loss of the master controller would then result in the loss of the cooling system as a whole, which the invention is intended to avoid by making it more robust in case of failures.

The change of liquid cooling module to inactive is scheduled in order to verify its availability as a redundant liquid cooling module, in other words a backup liquid cooling module, so that it can be operational in an emergency.

A sufficient number of liquid cooling modules to provide a sufficient flow of liquid coolant flow to the computer server 3 are continuously active at the same time; here, liquid cooling modules 4 and 5 are running while liquid cooling module 6 is inactive, held in reserve.

The cooling modules 4 to 6 supply the liquid coolant at a maximum constant temperature for each of the blades included in the computer servers 3 mounted in the rack of the server cabinet.

Two, or n strictly greater than two in the generalized case, of the liquid cooling modules 4 and 5 are active, while the other liquid cooling module 6 is active or inactive depending on the selected redundancy mode which may be basic redundancy or preferably optimized redundancy. Thus, if one of the active liquid cooling modules 4 or 5 is malfunctioning, the controller of the inactive liquid cooling module 6 is so informed by the network 2 and activates its liquid cooling module 6, so that the server cabinet continues to be cooled by at least two liquid cooling modules. Even in the event of failure or maintenance of one of the liquid cooling modules, the server cabinet can thus continue to function normally; however, in the unlikely event of a second failure before the repair of the first failure, consisting essentially of a standard replacement of the failed liquid cooling module, the cooling will of course deteriorate.

The liquid cooling modules 4 to 6 are removable for maintenance without stopping the cooling of the computer servers 3. The liquid cooling modules 4 to 6 allow regulating the coolant temperature, to ensure a constant temperature entering the computer servers 3 regardless of their heat dissipation.

In addition, the cooling modules 4 to 6 are able to detect failures by monitoring the pressure and temperature sensors via control means specific to each liquid cooling module. The hydraulic components of the cooling module are optimized for pressure loss consumption, in order to minimize the hydraulic energy that the pump 41 must provide and thus optimize its size and power consumption, and are optimized in terms of footprint, in order to improve the compactness of the liquid cooling module. The cooling system according to a preferred embodiment of the invention dissipates 120 kW for two active liquid cooling modules 4 and 5.

The liquid cooling modules 4 to 6 are identical to each other, so are interchangeable and can be replaced by a spare module stored locally in the computer room or nearby. A failed liquid cooling module should be repaired at another site; it is strongly advised not to open the liquid cooling module at the computer room site. Replacement liquid cooling modules are available on site.

The only maintenance operation allowed on site is the removal of the failed liquid cooling module and its replacement with a spare liquid cooling module with a few minutes, with no disruption of service for the computer servers 3 of the server cabinet.

The operation of a liquid cooling module, and therefore the proper cooling of the liquid cooling system, is unaffected or little affected by the presence or absence of the redundant additional module 6, or by whether or not the additional liquid cooling module 6 is operating in autonomous mode, which is a degraded mode of operation.

The effects of the connections and disconnections during maintenance are managed by the controllers of each liquid cooling module 4 to 6 so as to lessen the transient effects and maintain proper cooling of the computer servers 3 of the server cabinet.

Advantageously, these three cooling modules 4 to 6 are placed in a lower portion of the server cabinet, the computer servers 3 being placed in an upper portion of the same server cabinet. The lower portion is located beneath the upper portion when the server cabinet is installed (standing upright) and operational.

Having the cooling modules 4 to 6 beneath the computer servers 3 prevents the fluid coolant from flowing onto the computer servers 3, in case of significant leakage of liquid coolant from one of the cooling modules 4 to 6.

Figure 3:
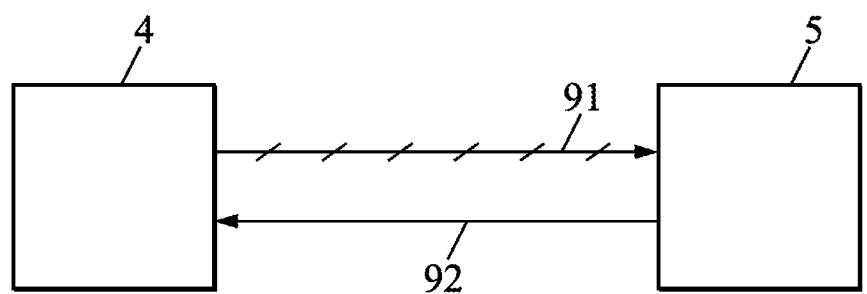
FIGS. 3 and 4 schematically represent an example of communication between different liquid cooling modules of a same server cabinet during an initialization phase according to one embodiment of the invention.
Figure 4:
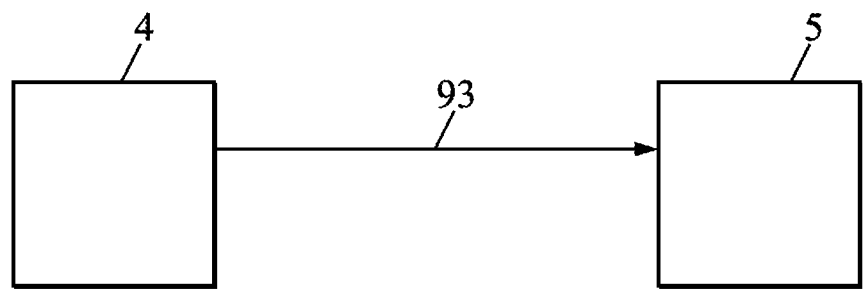

FIGS. 3 and 4 schematically represent an example of communication between different liquid cooling modules of a same server cabinet during an initialization phase according to one embodiment of the invention.

In FIG. 3, a first liquid cooling module 4 broadcasts 91 data representative of its identity using a UDP broadcast protocol. The message 91 includes the identifier of the first cooling module, an identifier of its group of cooling modules included in its cooling cabinet, and its Internet address. A second cooling module 5 receiving this broadcast 91 sends back to the first liquid cooling module 4 a targeted message 92 which contains its own data representative of its own identity and an acknowledgment of the broadcast 91. Message 92 includes an acknowledgment of message 91, the identifier of the second cooling module, an identifier of its group of cooling modules included in its cooling cabinet (which is therefore the same as that of the first cooling module), its Internet address (the Internet address of the second cooling module). This is a first phase of identification that is carried out prior to the communication and data exchange phase described in FIG. 4 below. This first phase of identification is performed in broadcast mode using a TCP or UDP protocol. The table of Internet addresses of the cooling modules of the group may be constructed locally at each of the cooling modules, then enabling the process of exchanging information to update their operating state to occur. This broadcast is performed by each of the cooling modules multiple times during a period of 2 minutes, as this is an asynchronous communication, in order to allow the other liquid cooling modules to receive the broadcast. Each of the cooling modules then acts as both a client-type data transmitter and as a server-type data receiver.

In FIG. 4, the first liquid cooling module 4 periodically sends, to the other liquid cooling modules 5 and 6 of their shared server cabinet, a targeted message 93 containing a reminder of its data representative of its identity and an update to some of its operating parameters. Each of the other liquid cooling modules 5 and 6 does the same, in other words it periodically sends, to the other liquid cooling modules of their shared server cabinet, the same targeted message 93 containing a reminder of its data representative of its identity and an update to some of its operating parameters. The period used here is one second. The structure of the exchanged data is as follows, and may comprise in this order: the identifier of their common group, the identifier of the cooling module, one or more state variables, one or more cooling parameters, one or more cooling variables. The cooling module changes its state variables according to its environment. The status of the server cabinet is constructed by the general control and supervision system of the set of server cabinets, meaning the general control and supervision system of the computer cluster. For this purpose, this general control and supervision system may query each cooling module, for example periodically using IPMI ("Intelligent Platform Management Interface") commands, for example every second. Alternatively, a script external to the server cabinet may query the various cooling modules periodically, for example every second.

Each of the liquid cooling modules 4 to 6 operates autonomously and regulates its operation without any of the liquid cooling modules 4 to 6 acting as a master managing the other modules as slaves, by means of the collaborative communication protocol between the liquid cooling modules 4 to 6. Each of the liquid cooling modules 4 to 6 can start up on its own. Each of the liquid cooling modules 4 to 6 knows the topology of its server cabinet and therefore of the group of associated liquid cooling modules, as well as its group identifier, as well as its position within the group, all this information being communicated to it by another computer network when the process of booting the server cabinet is initiated. The cooling module knows its group identifier and its position in the group independently of its Internet address which is communicated to it by DHCP ("Dynamic Host Configuration Protocol").

Figure 5:
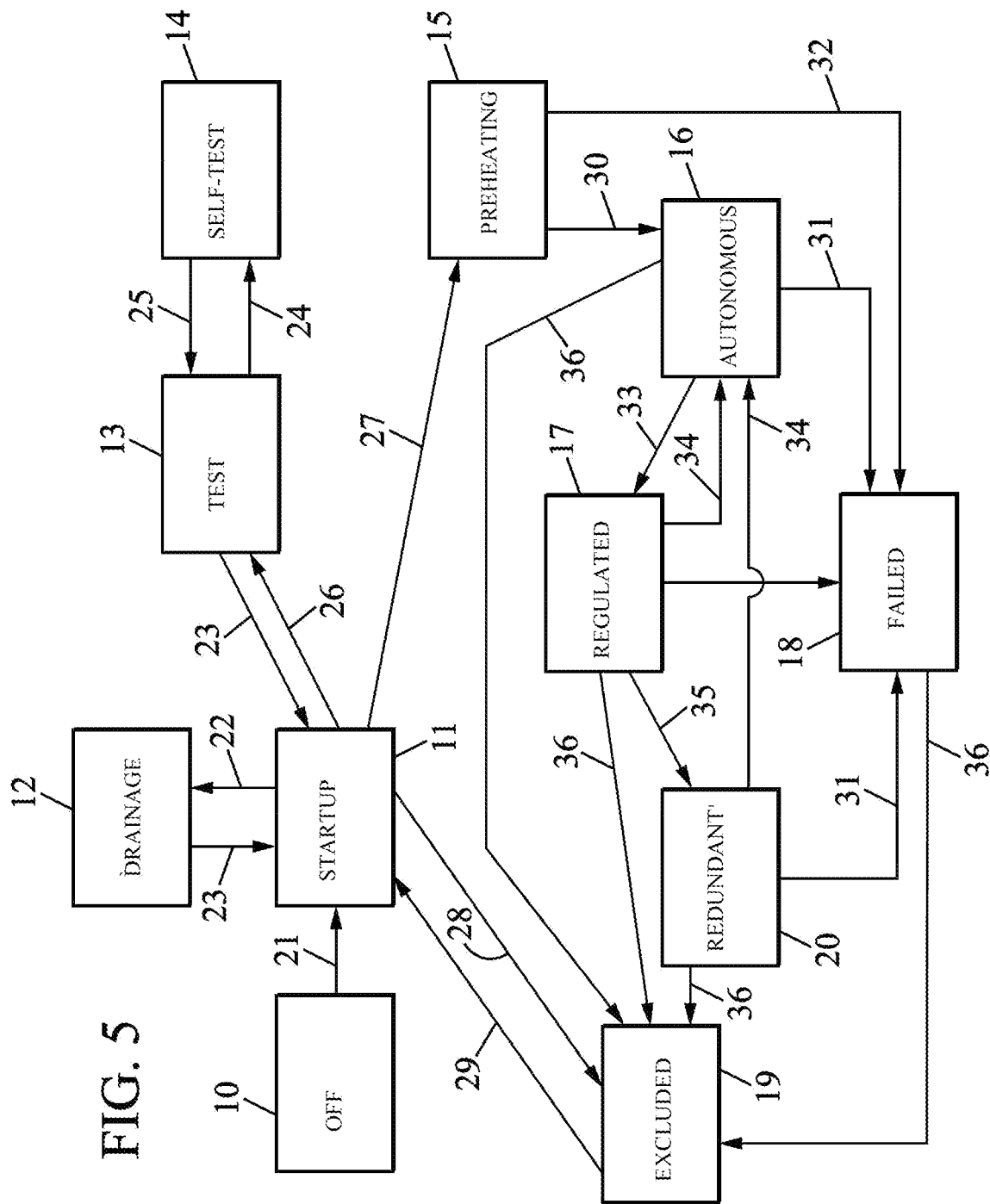
FIG. 5 schematically represents an exemplary flowchart of a liquid cooling module communicating with the other liquid cooling modules of the same server cabinet using a collaborative communication protocol according to one embodiment of the invention.

FIG. 5 schematically represents an exemplary flow diagram of a liquid cooling module communicating with the other liquid cooling modules of the same server cabinet using a collaborative communication protocol according to one embodiment of the invention.

The cooling modules communicate with each other via a collaborative protocol, without master or slave; they usually make their decisions unanimously, sometimes the majority decides.

The cooling module may take different states or statuses, including an off state 10, a startup state 11, a drain state 12, a test state 13, a self-test state 14, a preheating state 15, an autonomous status 16, a regulated status 17, a failed status 18, an excluded status 19, a redundant status 20.

In the off state 10, the cooling module is not receiving any electric power.

In the startup state 11, the cooling module is receiving electric power and is starting up.

In the drain state 12, the cooling module is performing maintenance which in particular allows draining the water from the primary circuit portion of the cooling module.

In the test state 13, the cooling module performs a test to verify that it is operating properly. Once the verification test is completed at the factory of the cooling module manufacturer, this cooling module is placed in excluded status 19, with default values for the cooling parameters. A new cooling module or a reserve cooling module will in principle be in excluded status 19. After manual insertion of a cooling module into the server cabinet, the cooling module will begin in excluded status 19 and will remain there until a new command is given. Next, the outside operator will then check the cooling parameters of this cooling module against those of the other cooling modules present in their shared server cabinet because they are in the same group of cooling modules. Only after this control phase can the cooling module be included in this group of cooling modules. While the cooling module remains in excluded status 19, it is the value of its own identifier that remains assigned to its redundant cooling module parameter.

In the self-test state 14, the cooling module itself performs a test to verify that it is operating properly.

In the preheating state 15, the cooling module performs a preheating.

In autonomous status 16, the cooling module is cooling properly but is not yet synchronized with the other cooling modules. If at least one of the cooling modules successfully reaches autonomous status 16, then electric power is supplied to the server cabinet as well as all the computer servers it contains.

In regulated status 17, the cooling module is cooling properly and is already synchronized with the other cooling modules.

In failed status 18, the cooling module is no longer operating properly and is no longer cooling correctly: it has failed. In failed status 18, the cooling module will turn off the power to its pump, in particular in two cases: when the risk of condensation becomes too high, or when the pressure in the secondary circuit becomes too low. Before changing to failed status 18, the cooling module will send an alert to the general administrator overseeing the server cabinets of the computer cluster. When all the cooling modules are in failed status 18, the general administrator overseeing the server cabinet can therefore see that they are all in failed status 18, that all pumps have stopped, that cooling has stopped, therefore that power needs to be turned off to the entire server cabinet, in other words to all the computer servers it contains. As long as a cooling module remains in failed status 18 and has not changed to excluded status 19, it can be reset by an operator outside the server cabinet. If the failure 31 does not recur during this reset, the cooling module will first enter autonomous status 16 and then possibly regulated status 17. If the failure 31 recurs during this reset, the cooling module will change, upon receipt of an exclusion command 36 from an outside operator, to excluded status 19.

In excluded status 19, the cooling module is explicitly excluded from the group of cooling modules. An explicit inclusion command is required in order to be reinstated into the group of cooling modules. Without this explicit inclusion command, even a power on command 21 or restart command 23 will not result in its reinstatement into its group of cooling modules. The restart command 23 may also be given from almost all other states or statuses, except from the off state 10.

In redundant status 20, the cooling module is redundant, in other words inactive, and is ready to switch to autonomous status 16 in order to replace another cooling module in their common group, to cool in its place, if that other cooling module has changed to failed status 18 or has been placed in excluded status 19.

The cooling module changes from one state or status to another, either by means of a command from an outside operator or by an operation that it carries out itself when the corresponding condition is met.

These commands or operations include a power on command 21, a drain command 22, a restart command 23, a self-test start command 24, a self-test exit command 25, a start test command 26, a cooling power command 27, an exclusion after failed startup command 28, an inclusion command 29, a preheating termination operation 30, a failure 31, a preheating failure 32, a data consistency discovery operation 33, a data inconsistency discovery operation 34, a switch-to-redundancy operation 35, an exclusion command 36.

The power on command 21 turns on the electric power to the cooling module and initiates startup of the cooling module. The power on command 21 switches the cooling module from an off state 10 to a startup state 11.

The drain command 22 gives the order to perform maintenance, in particular to enable draining the water from the primary circuit portion of the cooling module. The drain command 22 switches the cooling module from a startup state 11 to a drain state 12.

The restart command 23 instructs the cooling module to restart. The restart command 23 switches the cooling module from a drain state 12 to a startup state 11, or from a test state 13 to a startup state 11.

The self-test start command 24 instructs the cooling module to begin a self-test. The self-test start command 24 switches the cooling module from a test state 13 to a self-test state 14.

The self-test exit command 25 instructs the cooling module to stop the self-test. The self-test exit command 25 switches the cooling module from a self-test state 14 to a test state 13.

The start test command 26 instructs the cooling module to start a test. The start test command 26 switches the cooling module 13 from a test state to a startup state 11.

The cooling power command 27 instructs the cooling module to start preheating. The cooling power command 27 switches the cooling module from a startup state 11 to a preheating state 15.

The exclusion after failed startup command 28 excludes the cooling module from its group of cooling modules after it fails to start. The exclusion after failed startup command 28 switches the cooling module from a startup state 11 to excluded status 19.

The inclusion command 29 includes or re-includes the cooling module in its group of cooling modules. The inclusion command 29 switches the cooling module from excluded status 19 to a startup state 11. When the inclusion command 29 is sent to one of the cooling modules, then the inclusion process begins when this cooling module receives the inclusion command 29, preferably in the form of an IPMI command. This cooling module then assigns the value of its own identifier to its redundant cooling module parameter, which in fact should already be the case. This cooling module switches to the startup state 11, the cooling parameters normally having been previously initialized directly by the operator during the previous exclusion process. If a cooling power command 27 is received by the cooling module, the module will switch to autonomous status 16 first, and then to regulated status 17 if a data consistency discovery operation 33 is performed. Then, if the stability indicator also becomes positive, this cooling module will then move to redundant status 20 by a switch-to-redundancy operation 35.

The preheating termination operation 30 stops the preheating of the cooling module. The preheating termination operation 30 switches the cooling module from a preheating state 15 to autonomous status 16.

Failure 31 is a failure of the cooling module. Failure 31 causes the cooling module to switch to failed status 18 from autonomous status 16, or from regulated status 17, or from redundant status 20. When the failure 31 occurs for one of the cooling modules, then that cooling module assigns the value of its own identifier to its redundant cooling module parameter, and sends a request to the other cooling modules asking them to set their redundant cooling module parameter to the same value as itself. Then, the redundant cooling module leaves redundant status 20 to switch to regulated status 17 or rather quickly to autonomous status 16, because the stability indicator will become negative since one of the cooling modules, the one that just switched to failed status 18, is no longer in regulated status 17.

Preheating failure 32 is a failure of the cooling module that occurs during its preheating. Preheating failure 32 switches the cooling module to failed status 18 from preheating status 15.

The data consistency discovery operation 33 sets the consistency indicators of the cooling modules to positive or leaves them positive. The data consistency discovery operation 33 switches the cooling module from autonomous status 16 to regulated status 17.

The data inconsistency discovery operation 34 sets at least one of the consistency indicators of the cooling modules to negative or leaves it negative. The data inconsistency discovery operation 34 switches the cooling module to autonomous status 16 from regulated status 17, or from autonomous status 20. When one of the active cooling modules switches to failed status 18, it stops its pump, and the cooling module that was in redundant status 20 starts its pump on its own in order to switch to autonomous status 16.

The switch-to-redundancy operation 35 sets a single cooling module to inactive with the ability to resume cooling immediately in an emergency, in particular to replace a cooling module that has become faulty. The switch-to-redundancy operation 35 switches the cooling module from regulated status 17 to redundant status 20.

The exclusion command 36 excludes the cooling module from its group of cooling modules. The exclusion command 36 switches the cooling module to excluded status 19 from autonomous status 16, or from regulated status 17, or from failed status 18, or from redundant status 20.

When the exclusion command 36 is sent to one of the cooling modules, then the exclusion process begins when that cooling module receives the exclusion command 36, preferably in the form of an IPMI command. The cooling module then assigns the value of its own identifier to its redundant cooling module parameter, and sends a request to the other cooling modules asking them to set their redundant cooling module parameter to the same value as itself. Then, the redundant cooling module leaves redundant status 20 to switch to either autonomous status 16 or regulated status 17.

The exclusion command 36 is, for the cooling module to which it is sent, the first step in the process of removing a cooling module having failed status 18 from the server cabinet in order to perform maintenance on the cooling module.

In normal operating mode, the cooling modules communicate with each other periodically via a collaborative protocol in order to exchange a data set enabling them to check whether the data set is consistent, which will be expressed by a consistency indicator becoming positive, and then whether this data set remains consistent over time in a stable manner, which is expressed by a stability indicator becoming positive.

During this data exchange, each cooling module checks several things, namely it checks for a possible loss of communication with any of the other cooling modules, and it also checks the consistency of the exchanged data and the stability over time of the consistency of the exchanged data. These checks can be performed while the cooling module is in autonomous status 16 or regulated status 17 or redundant status 20.

Checking for a loss of communication between cooling modules consists of verifying for each cooling module that there have been no issues with loss of communication on the Ethernet network used by these cooling modules to communicate. Several scenarios can be envisaged for this.

First, one of the cooling modules may be reported missing, in other words it is no longer sending on the bus of the Ethernet network, in which case its data are no longer included in the group's data set and are no longer used for performing the data consistency discovery operation 33.

Next, two of the three cooling modules may be reported missing, in other words they are no longer sending on the bus of the Ethernet network, in which case only the data of the last cooling module still capable of communicating, therefore of sending on the Ethernet bus, are included in the group's data set and are used for performing the data consistency discovery operation 33.

Finally, one of the cooling modules may be switched to failed status 18 or excluded status 19, in which case its data are no longer included in the group's data set and are no longer used for performing the data consistency discovery operation 33.

Checking the consistency of the set of exchanged data may concern some or all of the exchanged data. Periodically, for example every second, a process will compare whether the cooling parameters are equal across all cooling modules, and whether this equality is maintained for at least 10 seconds.

The cooling parameters firstly include the redundant cooling module parameter, whose value is that of the identifier of the cooling module which is to switch to redundancy, in other words inactive, when the conditions are favorable, in other words when the switch-to-redundancy operation 35 takes place, and secondly include the cooling regulation parameter, whose value is that of the target temperature for the regulation of liquid coolant flowing in the secondary hydraulic circuit at the exchanger outlet.

In a phase of general initialization of a set of server cabinets, the general monitoring system of the computer room or an outside operator (a human responsible for the supervision or maintenance of the computer room) can initialize the cooling parameters of each server cabinet by sending IPMI commands to all cooling modules of the corresponding server cabinet. Normally, these commands will be sent and received by all the cooling modules at substantially the same time. For additional security, a safety margin may be added and the time slot for such communications may be extended to 10 seconds. After each cooling module has received the IPMI commands, it changes its cooling parameters and switches to regulated status 17. The other cooling modules in turn also have a time slot of 10 seconds for receiving these cooling parameter values, updating their cooling parameters with these received values, and sending their own cooling parameters to the other cooling modules. If this data exchange is not completed within the allotted time, then each cooling module having noted the failure will switch to autonomous status 16, as the consistency indicator will be negative.

The consistency indicator remains or becomes positive when the following three conditions are met simultaneously. The first condition is met when all data exchanged between cooling modules have been updated within at most 2 seconds, meaning that at most one sent update was missed by any of the cooling modules. The second condition is met when the redundant cooling module parameters are equal for all cooling modules of the group, and this has been true for at least 10 seconds. The third condition is met when the cooling regulation parameters are equal for all cooling modules of the group, and this has been true for at least 10 seconds.

Conversely, the consistency indicator remains or becomes negative when at least one of the three above conditions is not or is no longer met. When the consistency indicator is positive, the cooling module can switch from autonomous status 16 to regulated status 17. When the consistency indicator is negative, the cooling module which is in autonomous status 16 remains there. In case of persistence of a negative consistency indicator, corrective action is implemented, for example by the outside operator, to analyze and correct the cooling parameter or parameters that are responsible for the persistence of a negative consistency indicator.

Checking the stability of the set of exchanged data may concern some or all of the exchanged data. The stability check concerns the same data as the consistency check. Periodically, for example every second, a process will verify that the consistency indicator remains positive for a certain period of time during which the cooling modules remain synchronized with each other and none of them have received a cooling malfunction alarm. When the stability indicator remains or becomes positive, the cooling module that is to become inactive, in other words redundant, will actually become redundant or remain so if it is already.

The stability indicator remains or becomes positive when the following three conditions are met simultaneously. The first condition is met when all the consistency indicators at the cooling modules remain positive for at least 3 minutes. The second condition is met when no cooling malfunction alarm has been received by a cooling module. Such a cooling malfunction alarm may for example be received because a pump or exchanger has become defective. The third condition is met when at least two of the three (or n of the n+1) cooling modules of the group are in regulated status 17, the third (or last) cooling module of the group being either in regulated status 17 or redundant status 20.

Conversely, the stability indicator remains or becomes negative when at least one of the three above conditions is not or is no longer met. When the stability indicator is positive and one of the cooling modules has its cooling module parameter pointing to its own identifier, then this cooling module can switch from regulated status 17 to redundant status 20, but only in this case. When the stability indicator is negative, no cooling module can switch to redundant status 20 but must instead remain in regulated status 17.

Figure 6:
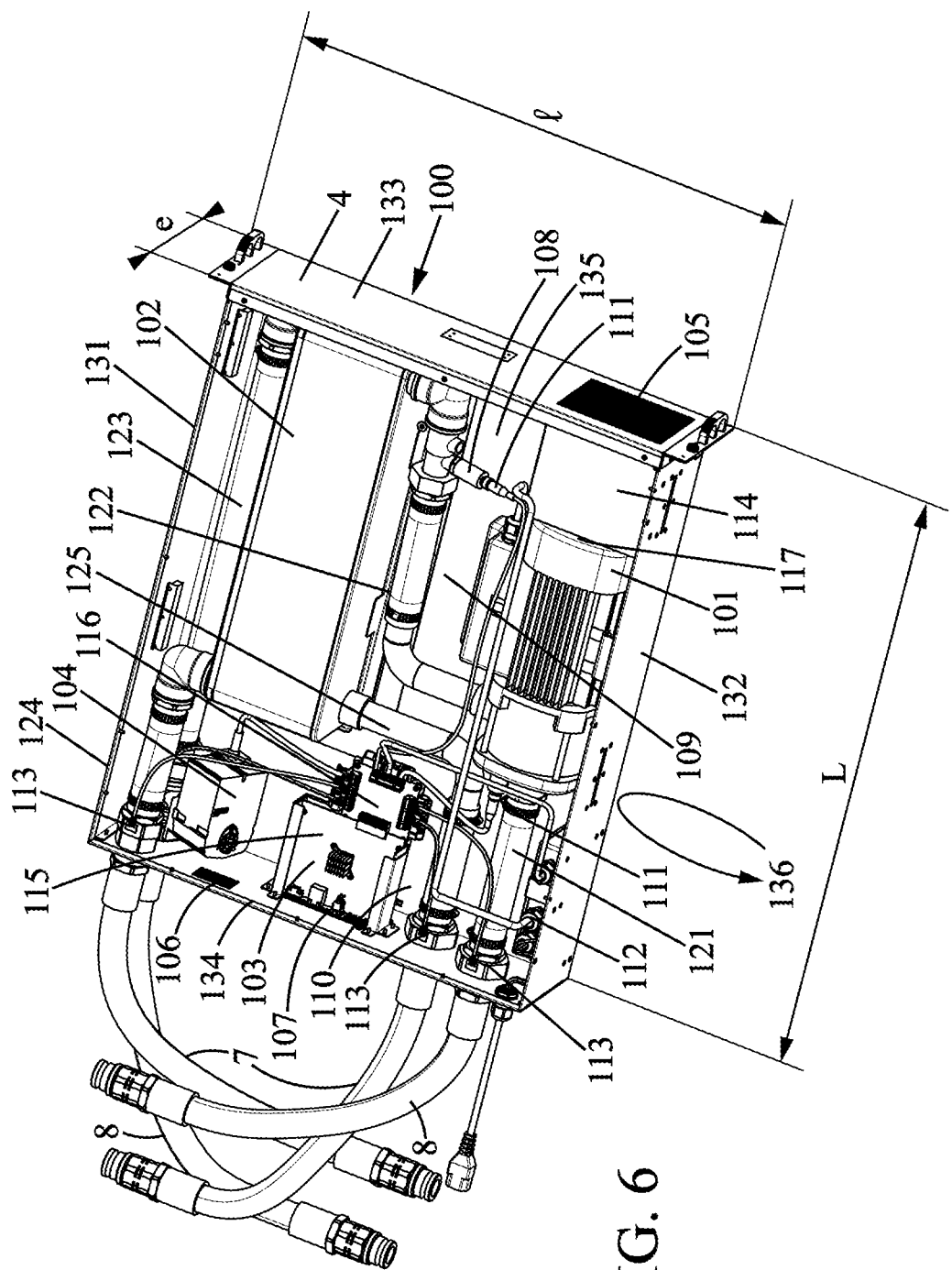
FIG. 6 shows the internal arrangement of an exemplary compact liquid cooling module according to one embodiment of the invention.

FIG. 6 shows the internal arrangement of an exemplary compact liquid cooling module according to an embodiment of the invention. The cooling module dissipates approximately 60 kW. The cooling module comprises an outer housing 100 incorporating several components. The fluid coolant is a liquid coolant, for example glycol-water. A primary hydraulic circuit 7 containing a liquid coolant crosses a secondary hydraulic circuit 8 containing a liquid coolant, without mixing liquid coolants but with an exchange of heat between liquid coolants, within the outer housing 100 of the liquid cooling module, inside a heat exchanger 102.

The outer housing 100 comprises two long side walls 131 and 132 which are opposite one another, two short side walls 133 and 134 which are opposite one another, and a bottom 135 which is opposite a cover 136 not visible in FIG. 6 because it has been removed to show the interior of the outer housing 100. The terms "long" and "short" only mean that the long side walls 131 and 132 are longer than the short side walls 133 and 134. The general shape of the outer housing 100 is a parallelepiped. The long side walls 131 and 132 are substantially of equal length. The short side walls 133 and 134 are substantially of equal length. The outer housing 100 has a length L of 76 cm, a width 1 of 59.5 cm, and a thickness e of 15 cm. Among the components incorporated within the outer housing 100 are a pump 101, a heat exchanger 102, a circuit board 103, a valve 104, an intake grille 105, two discharge grilles 106 and 107, a check valve 108, an open central longitudinal space 109, a leak detector 110, pressure sensors 111, an electric relay 112, temperature sensors 113, an air guide 114, a fan 117, pipes 121 to 123 in the secondary hydraulic circuit 8, pipes 124 and 125 in the primary hydraulic circuit 7. The terms "pipes" and "hoses" are used interchangeably.

The pump 101 is oriented in the lengthwise direction of the outer housing 100 and is positioned along the long side wall 132; it is right next to this long side wall 132. The axis of the pump 101 is aligned with the upstream hose 121 so as to have a regular supply to the pump 101. This upstream hose 121 is flexible in order to connect the pump 101, which allows compensating for misalignments and allows removal of the pump 101 for maintenance.

The heat exchanger 102 is oriented in the lengthwise direction of the outer housing 100 and is located along the other long side wall 131, arranged close to the other long side wall 131 without any other member between them except a pipe. The heat exchanger 102 is an exchanger 102 lying on its side to minimize its footprint, a cross-flow plate exchanger 102 of copper-brazed stainless steel, in order to have better heat exchange performance.

An outer insulation layer surrounds the heat exchanger 102 and the pipe or pipes 124 and 125 of a portion of primary hydraulic circuit 7 located within the cooling module, so as to prevent condensation on their outer walls, even when the temperature of the outer walls is less than the dew point temperature of the cooling module. This insulation on the exchanger 102 and on the hoses 124 and 125 of the primary circuit 7 thus eliminates a condensation monitoring system capable of triggering a cooling malfunction alarm unnecessarily. The pipes 124 and 125 have bends at the outlet and inlet of the exchanger 102 in order to minimize the occupied space.

The circuit board 103 itself comprises two portions, a logic portion 115 and a connection portion 116. This circuit control board 103 is positioned in the longitudinal extension of the open central longitudinal space 109 so as to be directly swept by the flow of air passing through. The two portions 115 and 116 of this circuit board 103 which can be separated from one another, are a logic portion 115 removable without disassembling the rest of the cooling module, and a connection portion 116 fixed to the bottom 135 of the cooling module without being separately removable. All the connections of the liquid cooling module components leading to this circuit board 103 are connected to this connection portion 116. This circuit board 103 does not comprise a protective cover and is in direct contact with all the airflow coming from the open central longitudinal space 109. This circuit board 103 dissipates about 10 W of heat. This circuit board 103 is a centralized regulating circuit board, cooled by the airflow created by the fan 117 of the pump 101.

The valve 104 is located on a portion of primary hydraulic circuit 7 located in the cooling module, having the function of indirectly regulating the coolant temperature in the secondary hydraulic circuit 8 at the outlet of the heat exchanger 102, the valve 104 preferably being a throttling ball valve 104. This throttling ball valve 104 comprises a device for adjusting the cross-sectional area of flow, favoring linearity in the flow response versus opening angle, with a servomotor mounted on its side to minimize its footprint, with an electric control enabling precise opening and a more precise reading of this opening than with a proportional solenoid valve.

The inlet ventilation grille 105 is located in short side wall 133. The two discharge ventilation grilles 106 and 107 are respectively located in short side wall 134. Grille 106 is a first ventilation grille 106 allowing air to exit the cooling module and is located just downstream of the circuit board 103. Grille 107 is a second ventilation grille 107 allowing air to exit the cooling module and is located just downstream of the valve 104. The sum of the surface areas of the air discharge ventilation grilles 106 and 107 is equal to the surface area of the air intake ventilation grille 105.

The check valve 108 is located on the segment of secondary hydraulic circuit 8 that is located between the outlet of the pump 101 and the inlet of the heat exchanger 102. The check valve 108 is located near the heat exchanger 102 in order to create a removable unit, which is of interest because it eliminates the risk of flows from other cooling modules entering this one when its pump 101 is stopped.

The open central longitudinal space 109 is arranged between the pump 101 and the heat exchanger 102 in a manner that facilitates airflow from a grille 105 of one short side wall 133 to the two grilles 106 and 107 of the other short side wall 134, this airflow being driven by the fan 117 of the pump 101.

A portion of secondary hydraulic circuit 8 located in the liquid cooling module, for circulating liquid coolant, does not comprise any bypass that would allow the pump 101 to operate as a closed circuit and which would clutter this open central longitudinal space 109. This open central longitudinal space 109 between the components of the cooling module is sufficient to facilitate the passage of cooling air between the upstream grille 105 and the downstream grilles 106 and 107, so that both the circuit board 103 and the valve 104 are properly cooled.

The leak detector 110 is located in the bottom 135 of the outer housing 100. The leak detector 110 is placed near the drainage hose 125; the bottom 135 of the outer housing 100 is fluidtight and can accommodate a substantial amount of liquid in case of leakage. A leak is only detected if it is relatively large; small leaks are deliberately ignored because they do not really pose a problem.

The pressure sensors 111 are respectively located at the inlet and outlet of the pump 101, in order to check its operation.

The electric relay 112 of the pump 101 is housed in a waterproof casing which accommodates high voltages to the pump 101, as alternating current.

The temperature sensors 113 ensure the monitoring and regulation of the circulation of liquid coolant in the primary 7 and secondary 8 circuits: there is one at each pipe 121, 122, 124, 125, near where they pass through the short side wall 134.

The air guide 114 channels air between the air intake ventilation grille 105 in the cooling module and the inlet of the pump 101. As the pump 101 is placed near the grille 105 on the front face of the outer housing 100, its fan 117 draws in fresh air from the outside through this grille 105, with the air guide 114 preventing the hot air that has already traveled through the cooling module from being pulled back in.

The air cooling fan 117 of the pump 101 is coupled to the electrically-powered shaft of the motor of the pump 101.

The pipe 121 located upstream of the pump 101 in the secondary hydraulic circuit 8 and the pipe 122 located between the pump 101 and the exchanger 102 in the secondary hydraulic circuit 8, as well as the pipe 123 located downstream of the heat exchanger 102 in the secondary hydraulic circuit 8, form the portion of secondary circuit 8 located in the cooling module.

The pipe 124 located upstream of the heat exchanger 102 in the primary hydraulic circuit 7 and the pipe 125 located downstream of the heat exchanger 102 in the primary hydraulic circuit 7, form the portion of primary circuit 7 located in the cooling module.

The bends of the various pipes 121 to 125 have a large radius of curvature, in order to minimize pressure loss and to avoid interfering with the flow of liquid coolant in these pipes 121 to 125. The pass-throughs in the short side wall 134 of the outer housing 100 are compact and do not present a significant change in the area of flow, in order to minimize pressure loss.

The primary 7 and secondary 8 circuits comprise flexible connectors that are properly aligned with the rigid pipes 121 to 125 in order to minimize changes in the cross-sectional areas of flow and disruptions to the flow of liquid coolant. Similarly, pressure fluctuations are reduced as are the vibrations generated in the cooling module and in the rest of the server cabinet. In addition, erosion is also minimized by the regularity of the flow of liquid coolant in the rigid pipes 121 to 125.

Of course, the present invention is not limited to the examples and to the embodiment described and represented, but is capable of many variants accessible to the skilled person.

The invention claimed is:

1. A method of communicating between a plurality of liquid cooling modules of a cooling system for one or more computer servers, each liquid cooling module comprising an outer housing surrounding a primary hydraulic circuit configured to contain a first liquid coolant, a secondary hydraulic circuit configured to contain a second liquid coolant, a heat exchanger capable of exchanging heat between the first and second liquid coolants, and a control circuit board, the method comprising:
    communicating, by the liquid cooling modules with each other in a manner that operates in N+1 redundancy with a collaborative protocol without a master/slave relationship, where N is greater than or equal to 2, to enable a standard replacement of any one of the plurality of liquid cooling modules with a redundant liquid cooling module of the plurality of liquid cooling modules without stopping cooling and without stopping an operation of the one or more computer servers; and
    before switching from an active mode in which cooling is performed to a backup mode in which cooling is no longer performed, the redundant liquid cooling module of the plurality of liquid cooling modules verifies beforehand that a data set is consistent across all of the plurality of liquid cooling modules and that the consistent data set is maintained for a predetermined amount of time.

2. The method of communicating between the plurality of liquid cooling modules according to claim 1, wherein:
    the plurality of liquid cooling modules communicate with each other over an Ethernet network.

3. The method of communicating between the plurality of liquid cooling modules according to claim 2, wherein:
    the Ethernet network carries external commands to the one or more computer servers and is a general network of a computer cluster grouping a plurality of server cabinets that participate in executing a same computing task.

4. The method of communicating between the plurality of liquid cooling modules according to claim 1, further comprising:
    during an initialization phase, broadcasting, by each liquid cooling module of the plurality of liquid cooling modules, at least a cooling module identifier identifying the respective liquid cooling module and a server cabinet identifier identifying a server cabinet in which said respective cooling module is located.

5. The method of communicating between the plurality of liquid cooling modules according to claim 4, wherein:
    during the initialization phase, sending back, by each liquid cooling module of the plurality of liquid cooling module having received the cooling module identifier of another one of the liquid cooling modules located in the same server cabinet as the respective liquid cooling module, a targeted message acknowledging receipt and communicating said cooling module identifier of the respective liquid cooling module and an identifier of the server cabinet, to form an information exchange group isolated from other liquid cooling modules belonging to other information exchange groups.

6. The method of communicating between the plurality of liquid cooling modules according to claim 5, further comprising:
    after completion of the initialization phase, periodically sending, by each liquid cooling module of the plurality of liquid cooling modules, with a refresh period, data of said respective liquid cooling module to the other liquid cooling modules of the information exchange group said respective liquid cooling module has identified.

7. The method of communicating between the plurality of liquid cooling modules according to claim 1, wherein:
    each of the liquid cooling modules is configured to have at least two statuses:
        in active mode, an autonomous status in which the respective liquid cooling module is cooling properly but fails to synchronize with all the other liquid cooling modules, and
        in active mode, a regulated status in which the respective liquid cooling module is cooling properly and is able to synchronize with all the other liquid cooling modules.

8. The method of communicating between the plurality of liquid cooling modules according to claim 7, wherein:
    each of the liquid cooling modules is configured to have at least the following two statuses:
        in case of failure, a failed status in which the respective liquid cooling module stops cooling properly when the respective liquid cooling module should be continuing to cool properly, and
        in backup mode, a redundant status in which the respective liquid cooling module is inactive but remains ready to immediately replace another one of the liquid cooling modules when the other one of the liquid cooling modules fails.

9. The method of communicating between the plurality of liquid cooling modules according to claim 8, wherein:
    when one of the liquid cooling modules switches to the failed status, said respective liquid cooling module shuts down a pump of said respective liquid cooling module, the pump configured to circulate fluid coolant in a secondary hydraulic circuit.

10. The method of communicating between the plurality of liquid cooling modules according to claim 7, wherein:
    when one of the cooling modules successfully reaches the autonomous status at a start, a server cabinet and the one or more computer servers contained in the server cabinet are started up.

11. The method of communicating between the plurality of liquid cooling modules according to claim 7, wherein:
    the liquid cooling modules each have a set of parameters comprising:

a redundant cooling module parameter pointing to the identifier of one of the liquid cooling modules that is authorized to switch to a redundant status at a next opportunity, and at least one cooling regulation parameter pointing to a setpoint for a parameter regulating the cooling.

12. The method of communicating between the plurality of liquid cooling modules according to claim 11, wherein:
the at least one cooling regulation parameter is a target temperature of fluid coolant in a secondary hydraulic circuit as the fluid coolant exits a heat exchanger.

13. The method of communicating between the plurality of liquid cooling modules according to claim 11, wherein:
each of the liquid cooling modules has a consistency indicator:
which is positive when the following three conditions are met simultaneously:
said respective liquid cooling module receives values from all the other liquid cooling modules, for at least the redundant cooling module parameter and the cooling regulation parameter, updated within a first predetermined duration,
all received values for the redundant cooling module parameter are equal to its own value for the redundant cooling module parameter, for more than a second predetermined duration, and
all received values for the cooling regulation parameter are equal to its own value for the cooling regulation parameter, for more than a third predetermined duration; and
which is negative when at least one of the three conditions is not met,
said respective liquid cooling module only switching from the autonomous status to the regulated status when the consistency indicator of said respective liquid cooling module becomes positive.

14. The method of communicating between the plurality of liquid cooling modules according to claim 13, wherein:
the first predetermined duration is at least twice a period of data refresh by the liquid cooling modules.

15. The method of communicating between the plurality of liquid cooling modules according to claim 13, wherein:
the second and third predetermined durations are between 5 and 60 seconds.

16. The method of communicating between the plurality of liquid cooling modules according to claim 13, wherein:
when one of the liquid cooling modules of the plurality of liquid cooling modules is no longer communicating said cooling module identifier of the respective liquid cooling module to the other cooling modules, said data of the respective liquid cooling module stored in memory are no longer taken into account in evaluating the consistency of the other cooling modules.

17. The method of communicating between the plurality of liquid cooling modules according to claim 13, wherein:
each of the cooling modules has a stability indicator:
which is positive when the following three conditions are met simultaneously:
the consistency indicators of all of the liquid cooling modules have been positive for at least a fourth predetermined duration,
none of the liquid cooling modules receives any cooling malfunction alarm, and
at most one of the cooling modules is in the redundant status, and all remaining cooling modules other than the cooling module in the redundant status are in the regulated status; and
which is negative when at least one of the three conditions is not met,
said respective liquid cooling module only switching from the regulated status to the redundant status when the following two conditions are met simultaneously:
the redundant cooling module parameter of the respective liquid cooling module points to said own cooling module identifier, and
the stability indicator of the respective liquid cooling module becomes positive.

18. The method of communicating between the plurality of liquid cooling modules according to claim 17, wherein:
the fourth predetermined duration is longer than 1 minute.

19. The method of communicating between the plurality of liquid cooling modules according to claim 18, wherein:
when all of the liquid cooling modules remain in the autonomous status for at least a fifth predetermined duration, then intervention by an operator outside a server cabinet occurs.

20. The method of communicating between the plurality of liquid cooling modules according to claim 13, wherein:
when one of the liquid cooling modules switches to a failed status, data of the failed status liquid cooling module are no longer taken into account in evaluating the consistency indicators of the other liquid cooling modules.

21. The method of communicating between the plurality of liquid cooling modules according to claim 11, wherein:
the data sent by each of the cooling modules to the other liquid cooling modules comprise:
an identifier of a group of cooling modules including the respective cooling module and configured to communicate with each other and located in a same server cabinet, together cooling a group of computer servers located in the same server cabinet,
the cooling module identifier of the respective liquid cooling module,
the value of the redundant cooling module parameter of the respective liquid cooling module,
a value of the cooling regulation parameter of the respective liquid cooling module, and
a boolean parameter corresponding to a presence or an absence of a cooling malfunction alarm.

22. The method of communicating between the plurality of liquid cooling modules according to claim 6, wherein:
the refresh period is between 0.5 and 2 seconds.

23. The method of communicating between the plurality of liquid cooling modules according to claim 8, wherein:
when one of the liquid cooling modules switches to the failed status, then:
the redundant cooling module parameter of the failed status liquid cooling module points to the cooling module identifier of the failed status liquid cooling module,
a command is sent to the other liquid cooling modules to point their redundant cooling module parameter to the identifier of the failed status liquid cooling module,
the cooling module which is in a redundant status switches to the regulated status or the autonomous status, and
a supply of power to all functional elements of the failed status liquid cooling module except a circuit control board of the failed status liquid cooling module, is disabled.

24. The method of communicating between the plurality of liquid cooling modules according to claim 23, wherein:
when one of the liquid cooling modules switches to the failed status, said failed status liquid cooling module then switches to an excluded status, and then:
a first specific command from an operator dictates exclusion of the excluded status liquid cooling module,
a second specific command from the operator dictating inclusion of the excluded status liquid cooling module is required to restart the excluded status liquid cooling module, a simple reboot of the circuit control board of the excluded status cooling module not enabling said restart.

25. The method of communicating between the plurality of liquid cooling modules according to claim 23, wherein:
when one of the liquid cooling modules switches to the autonomous status, the regulated status, or the redundant status, the switched liquid cooling module proceeds directly to an excluded status without passing through the failed status, and then:
a first specific command from an operator dictates exclusion of the excluded status liquid cooling module, and
a second specific command from the operator dictating inclusion of the excluded status liquid cooling module is required to restart the excluded status liquid cooling module, the circuit control board of the excluded status cooling module not enabling said restart.

26. The method of communicating between the plurality of liquid cooling modules according to claim 24, wherein:
when one of the cooling modules leaves the excluded status, then:
the second specific command from the operator dictates the inclusion of the cooling module that leave the excluded status, and
power to all functional elements of the cooling module that failed is reactivated.

27. A method of communicating between a plurality of liquid cooling modules of a cooling system for one or more computer servers, each liquid cooling module comprising an outer housing surrounding a primary hydraulic circuit configured to contain a first liquid coolant, a secondary hydraulic circuit configured to contain a second liquid coolant, a heat exchanger capable of exchanging heat between the first and second liquid coolants, and a control circuit board, the method comprising:
communicating, by the liquid cooling modules with each other in a manner that operates in N+1 redundancy with a collaborative protocol without a master/slave relationship, where N is greater than or equal to 2, to enable a standard replacement of any one of the plurality of liquid cooling modules without stopping cooling and without stopping an operation of the one or more computer servers; and
before switching from an active mode in which cooling is performed to a backup mode in which cooling is no longer performed, a redundant liquid cooling module of the plurality of liquid cooling modules verifies beforehand that a data set is consistent across all of the plurality of liquid cooling modules and that the consistent data set is maintained for a predetermined amount of time, by using a consistency indicator enabling to verify that the synchronization between all the cooling modules has been achieved.

28. A method of communicating between a plurality of liquid cooling modules of a cooling system for one or more computer servers, each liquid cooling module comprising an outer housing surrounding a primary hydraulic circuit configured to contain a first liquid coolant, a secondary hydraulic circuit configured to contain a second liquid coolant, a heat exchanger capable of exchanging heat between the first and second liquid coolants, and a control circuit board, the method comprising:
communicating, by the liquid cooling modules with each other in a manner that operates in N+1 redundancy with a collaborative protocol without a master/slave relationship, where N is greater than or equal to 2, to enable a standard replacement of any one of the plurality of liquid cooling modules without stopping cooling and without stopping an operation of the one or more computer servers; and
before switching from an active mode in which cooling is performed to a backup mode in which cooling is no longer performed, a redundant liquid cooling module of the plurality of liquid cooling modules verifies beforehand that a data set is consistent across all of the plurality of liquid cooling modules and that the consistent data set is maintained for a predetermined amount of time,
wherein each of the plurality of liquid cooling modules comprises a cooling regulation and failure detection system.

* * * * *